US011521976B1

(12) United States Patent
Tsai et al.

(10) Patent No.: US 11,521,976 B1
(45) Date of Patent: Dec. 6, 2022

(54) SEMICONDUCTOR DEVICE WITH BIT LINE CONTACT AND METHOD FOR FABRICATING THE SAME

(71) Applicant: NANYA TECHNOLOGY CORPORATION, New Taipei (TW)

(72) Inventors: Yi-Ting Tsai, Kaohsiung (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/466,102

(22) Filed: Sep. 3, 2021

(51) Int. Cl.
*H01L 21/00* (2006.01)
*H01L 27/108* (2006.01)
*H01L 23/528* (2006.01)

(52) U.S. Cl.
CPC ...... *H01L 27/10814* (2013.01); *H01L 23/528* (2013.01); *H01L 27/10885* (2013.01); *H01L 27/10888* (2013.01)

(58) Field of Classification Search
CPC ............ H01L 27/10814; H01L 23/528; H01L 27/10885
See application file for complete search history.

(56) References Cited

U.S. PATENT DOCUMENTS

| 5,877,522 | A * | 3/1999 | Kasai | H01L 27/10888 |
| | | | | 257/E21.654 |
| 6,693,834 | B1 * | 2/2004 | Wu | H01L 27/0207 |
| | | | | 365/201 |
| 6,801,462 | B2 * | 10/2004 | Chang | H01L 27/10897 |
| | | | | 257/E21.654 |
| 6,844,207 | B2 * | 1/2005 | Wu | G11C 29/025 |
| | | | | 438/18 |
| 6,984,534 | B2 * | 1/2006 | Wu | G11C 29/025 |
| | | | | 438/386 |
| 9,337,149 | B2 * | 5/2016 | Im | H01L 27/10888 |
| 9,419,000 | B2 * | 8/2016 | Kim | H01L 27/10891 |
| 9,865,602 | B2 * | 1/2018 | Kwon | H01L 27/10885 |
| 10,461,153 | B2 * | 10/2019 | Lee | H01L 27/10894 |
| 10,573,652 | B2 * | 2/2020 | Lee | H01L 27/10823 |
| 10,937,791 | B1 * | 3/2021 | Huang | H01L 27/10852 |
| 10,978,459 | B2 * | 4/2021 | Su | G11C 5/02 |
| 11,037,933 | B2 * | 6/2021 | Chuang | H01L 28/90 |

(Continued)

FOREIGN PATENT DOCUMENTS

JP 2005032991 A * 2/2005 ........... G11C 15/043

*Primary Examiner* — Laura M Menz
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a first bit line structure positioned above the substrate and including a first line portion arranged in parallel to a first direction, and a second line portion connecting to a first end of the first line portion and arranged in parallel to a second direction in perpendicular to the first direction; a first bit line top contact including a first bar portion positioned on the first end of the first line portion and arranged in parallel to the first direction, and a second bar portion connecting to a first end of the first bar portion, positioned on the second line portion, and arranged in parallel to the second direction; and a first top conductive layer electrically coupled to the first bit line top contact.

20 Claims, 32 Drawing Sheets

(56) References Cited

U.S. PATENT DOCUMENTS

| | | | |
|---|---|---|---|
| 11,063,051 B2 * | 7/2021 | Huang | H01L 27/1085 |
| 11,121,134 B2 * | 9/2021 | Lee | H01L 27/10814 |
| 11,309,312 B2 * | 4/2022 | Shih | H01L 27/10891 |
| 11,417,574 B2 * | 8/2022 | Yang | H01L 27/10814 |
| 2013/0277802 A1 * | 10/2013 | Park | H01L 28/92 |
| | | | 257/532 |
| 2016/0035676 A1 * | 2/2016 | Im | H01L 29/0642 |
| | | | 257/306 |
| 2016/0181251 A1 * | 6/2016 | Yoo | H01L 29/0649 |
| | | | 257/296 |
| 2021/0351190 A1 * | 11/2021 | Ho | H01L 23/5226 |
| 2022/0139790 A1 * | 5/2022 | Yang | H01L 27/10876 |
| | | | 257/48 |

* cited by examiner

SEMICONDUCTOR DEVICE WITH BIT LINE CONTACT AND METHOD FOR FABRICATING THE SAME

TECHNICAL FIELD

The present disclosure relates to a semiconductor device and a method for fabricating the semiconductor device, and more particularly, to a semiconductor device with bit line contacts and the method for fabricating the semiconductor device with bit line contacts.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first bit line structure positioned above the substrate and including a first line portion arranged in parallel to a first direction, and a second line portion connecting to a first end of the first line portion and arranged in parallel to a second direction in perpendicular to the first direction; a first bit line top contact including a first bar portion positioned on the first end of the first line portion and arranged in parallel to the first direction, and a second bar portion connecting to a first end of the first bar portion, positioned on the second line portion, and arranged in parallel to the second direction; and a first top conductive layer electrically coupled to the first bit line top contact.

In some embodiments, the semiconductor device includes a source region positioned in the substrate. The first line portion of the first bit line structure is electrically coupled to the source region.

In some embodiments, the semiconductor device includes a second bit line structure positioned at a same vertical level as the first bit line structure and including a first line portion arranged in parallel to the first line portion of the first bit line structure and including a first end and a second end, and a second line portion connecting to the second end of the first line portion of the second bit line structure, arranged in parallel to the second line portion of the first bit line structure, and positioned toward the first line portion of the first bit line structure. The first end of the first line portion of the second bit line structure is positioned toward the second line portion of the first bit line structure and the second end of the first line portion of the second bit line structure is opposite to the first end of the first line portion of the second bit line structure.

In some embodiments, the semiconductor device includes a second bit line top contact positioned at a same vertical level as the first bit line top contact and including a first bar portion arranged in parallel to the first direction, positioned on the second end of the first line portion of the second bit line structure, and including a first end and a second end, and a second bar portion connecting to the second end of the first bar portion of the second bit line top contact, positioned on the second line portion of the second bit line structure, and arranged in parallel to the second line portion of the first bit line structure. The first end of the first bar portion of the second bit line top contact is positioned toward the second bar portion of the first bit line top contact and the second end of the first bar portion of the second bit line top contact is opposite to the first end of the first bar portion of the second bit line top contact.

In some embodiments, the semiconductor device includes a second top conductive layer electrically coupled to the second bit line top contact.

In some embodiments, the semiconductor device includes a third line portion connecting to the second line portion of the first bit line structure, aligned with the first line portion of the second bit line structure, and positioned toward to the first line portion of the second bit line structure.

In some embodiments, the semiconductor device includes a third bar portion connecting to the second bar portion of the first bit line top contact and positioned on the third line portion of the first bit line structure.

In some embodiments, the semiconductor device includes a third line portion connecting to the second line portion of the second bit line structure, aligned with the first line portion of the first bit line structure, and positioned toward to the first line portion of the first bit line structure.

In some embodiments, the semiconductor device includes a third bar portion connecting to the second bar portion of the second bit line top contact and positioned on the third line portion of the second bit line structure.

In some embodiments, a width of the first bar portion of the first bit line top contact is greater than a width of the first line portion of the first bit line structure.

In some embodiments, a width of the second bar portion of the first bit line top contact is greater than a width of the second line portion of the first bit line structure.

In some embodiments, the third line portion of the first bit line structure is completely covered by the second bar portion of the first bit line top contact in a top-view perspective.

In some embodiments, a width of the first bar portion of the second bit line top contact is greater than a width of the first line portion of the second bit line structure.

In some embodiments, a width of the second bar portion of the second bit line top contact is greater than a width of the second line portion of the second bit line structure.

In some embodiments, the third line portion of the second bit line structure is completely covered by the second bar portion of the second bit line top contact.

In some embodiments, a length of the second line portion of the first bit line structure is less than or equal to a distance between the first line portion of the first bit line structure and the first line portion of the second bit line structure.

In some embodiments, a length of the second bar portion of the first bit line top contact is equal to or less than a length of the first bar portion of the first bit line top contact.

In some embodiments, a length of the second bar portion of the first bit line top contact is greater than a length of the first bar portion of the first bit line top contact.

In some embodiments, a length of the second bar portion of the first bit line top contact is greater than or equal to a length of the second line portion of the first bit line structure.

Another aspect of the present disclosure provides a method for fabricating a semiconductor device including providing a substrate; forming a first bit line structure above the substrate and including a first line portion arranged in parallel to a first direction, and a second line portion connecting to a first end of the first line portion and arranged in parallel to a second direction in perpendicular to the first direction; forming a first bit line top contact including a first bar portion on the first end of the first line portion and arranged in parallel to the first direction, and a second bar portion connecting to a first end of the first bar portion, on the second line portion, and arranged in parallel to the second direction; and forming a first top conductive layer electrically coupled to the first bit line top contact.

Due to the design of the semiconductor device of the present disclosure, the contact areas between the first bit line structure and the first bit line top contact and between the second bit line structure and the second bit line top contact may be greater. Therefore, the contact resistance between the first bit line structure and the first bit line top contact and between the second bit line structure and the second bit line top contact may be reduced. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
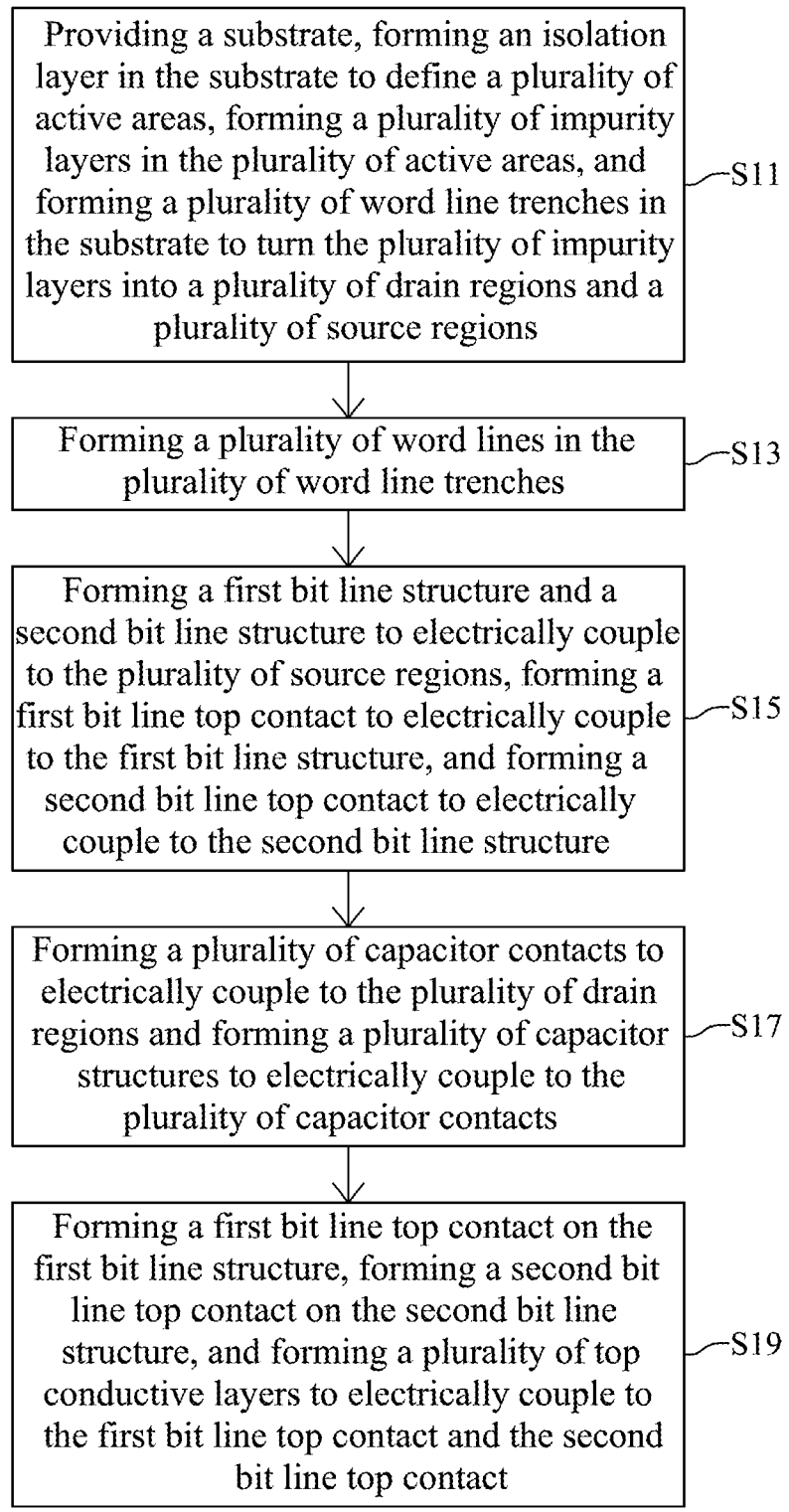
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
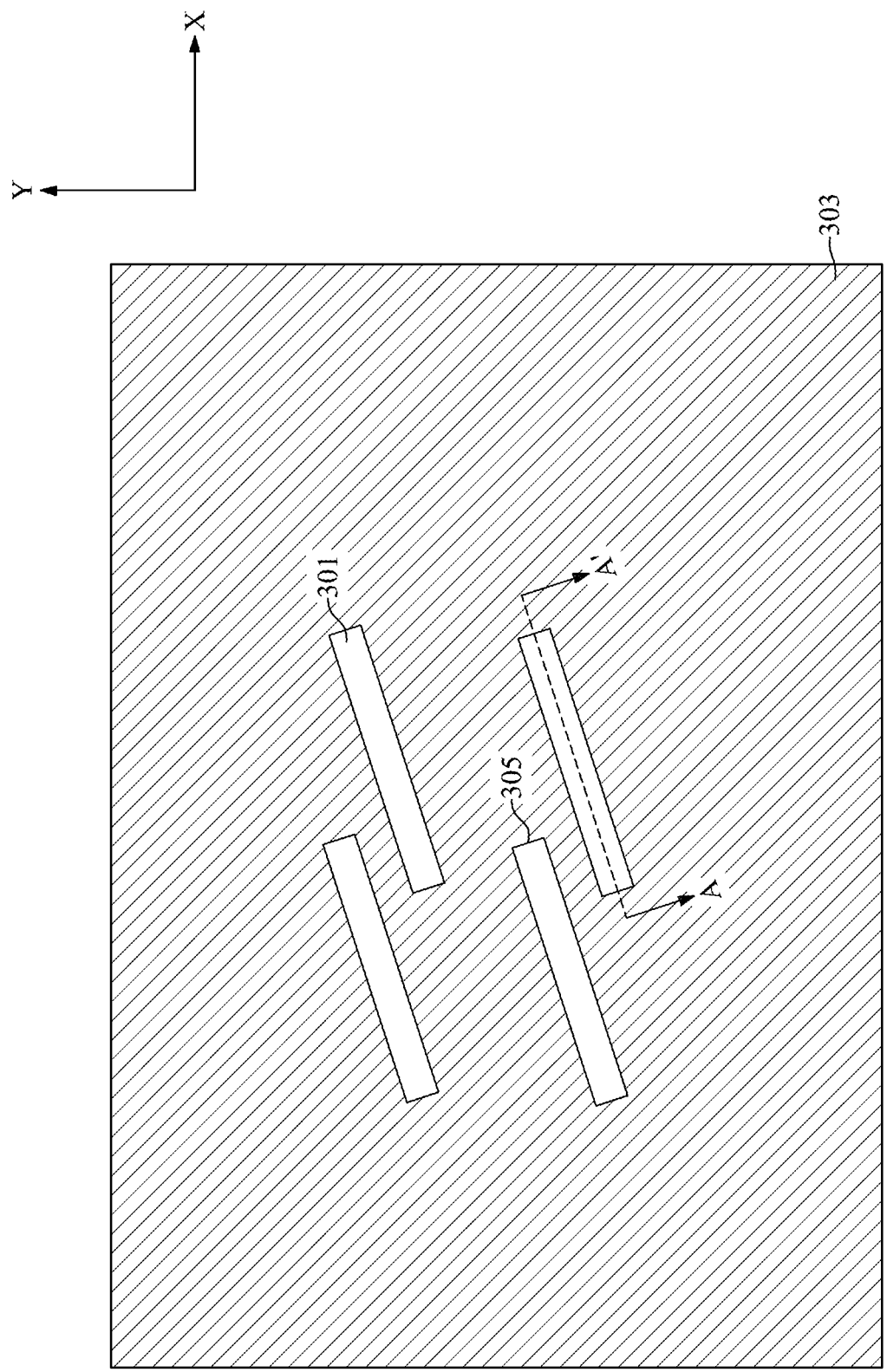
FIG. 2 illustrates, in a schematic top-view diagram, an intermediate semiconductor device in accordance with one embodiment of the present disclosure.
Figure 3:
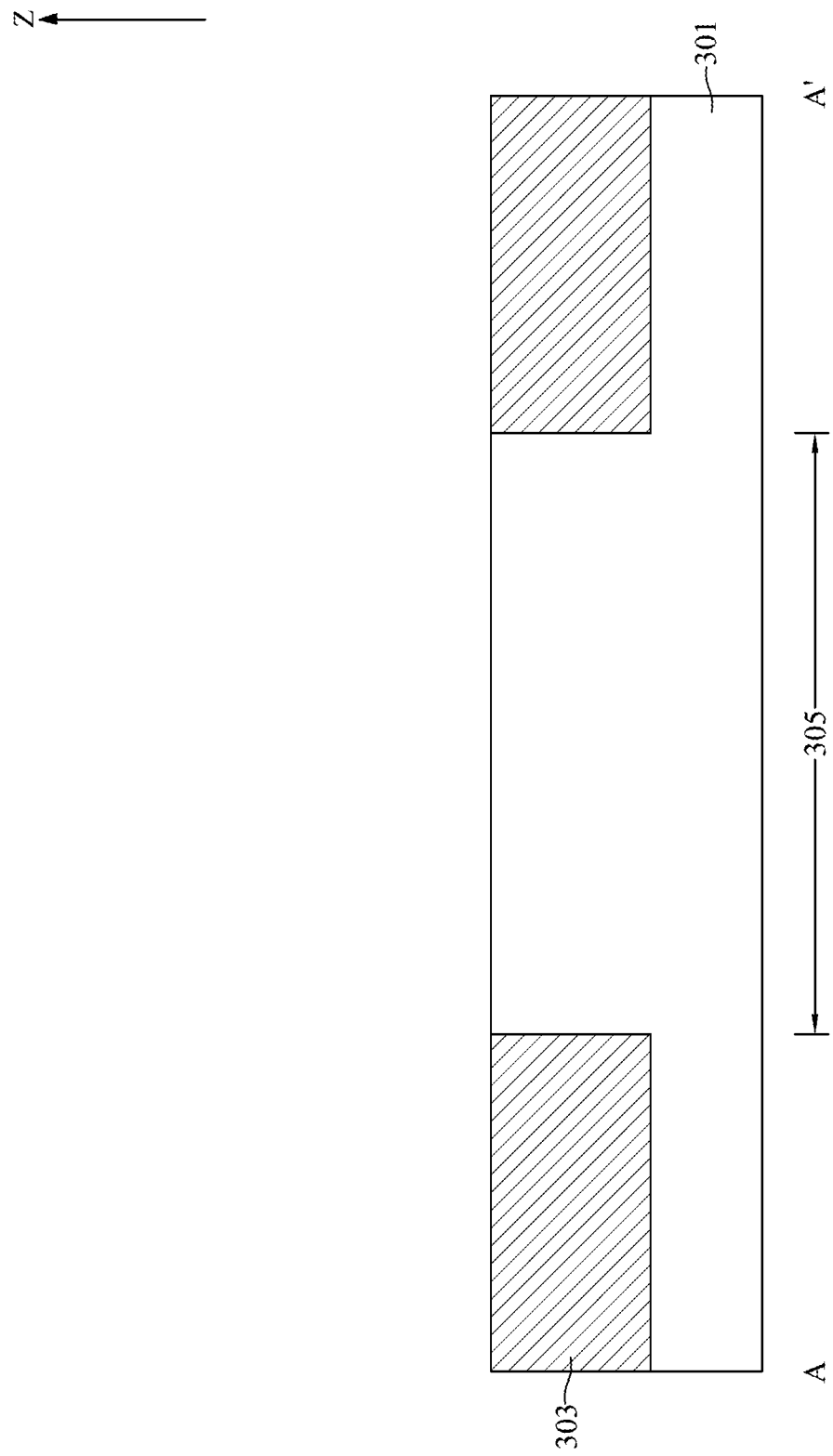
FIG. 3 is a schematic cross-sectional view diagram taken along a line A-A' in FIG. 2.
Figure 4:
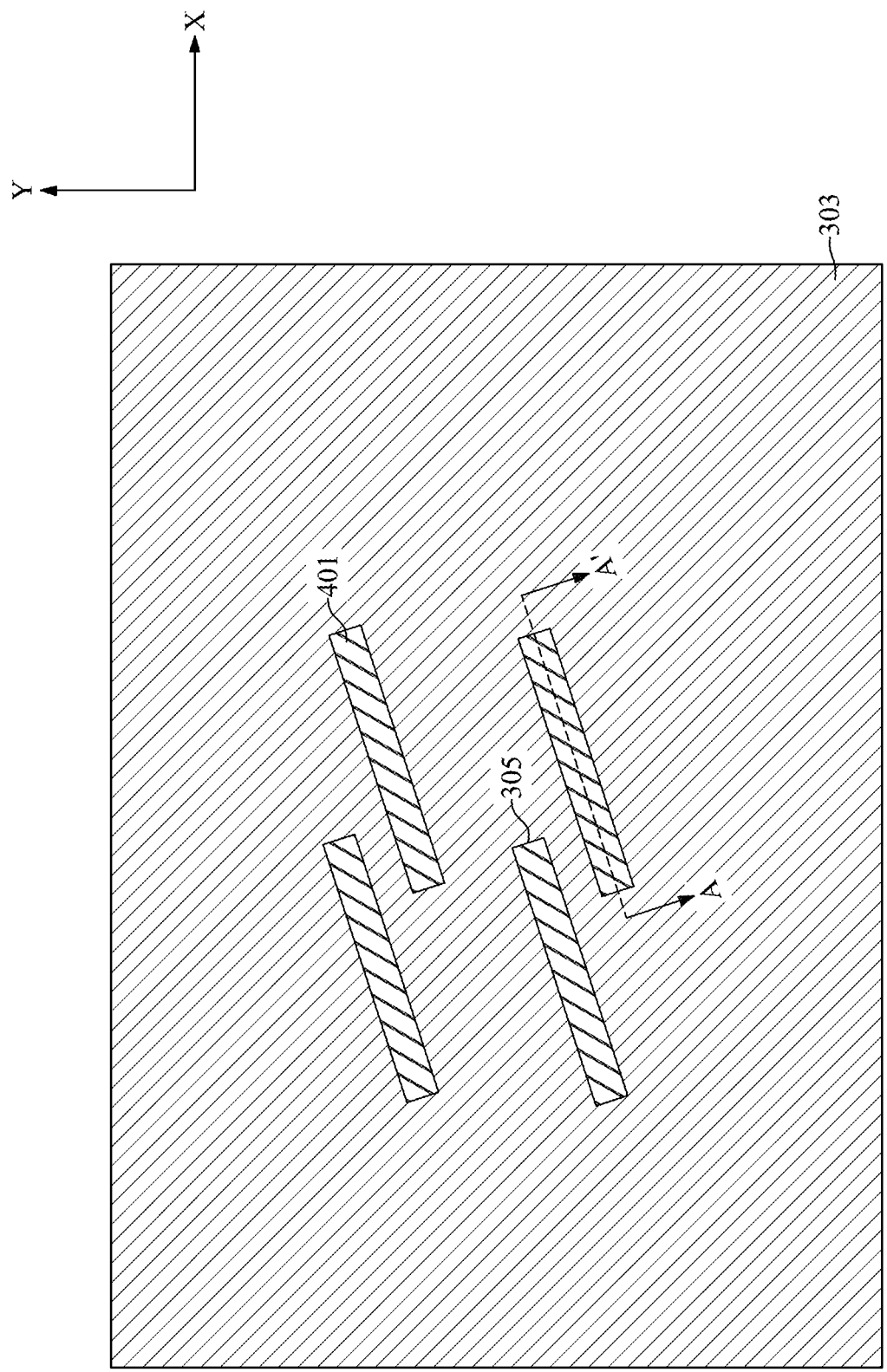
FIG. 4 illustrates, in a schematic top-view diagram, an intermediate semiconductor device in accordance with one embodiment of the present disclosure.
Figure 5:
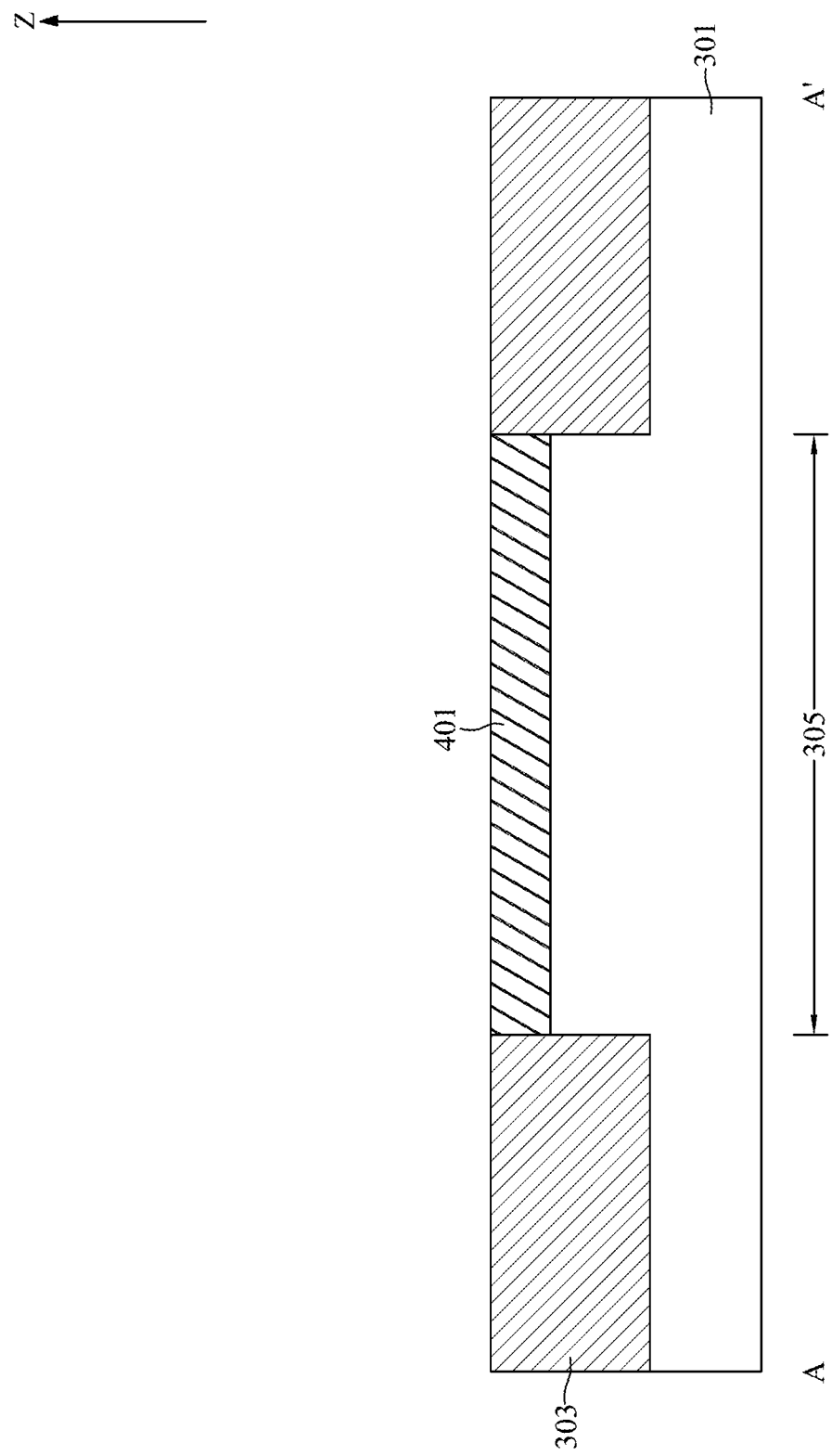
FIG. 5 is a schematic cross-sectional view diagram taken along a line A-A' in FIG. 4.
Figure 6:
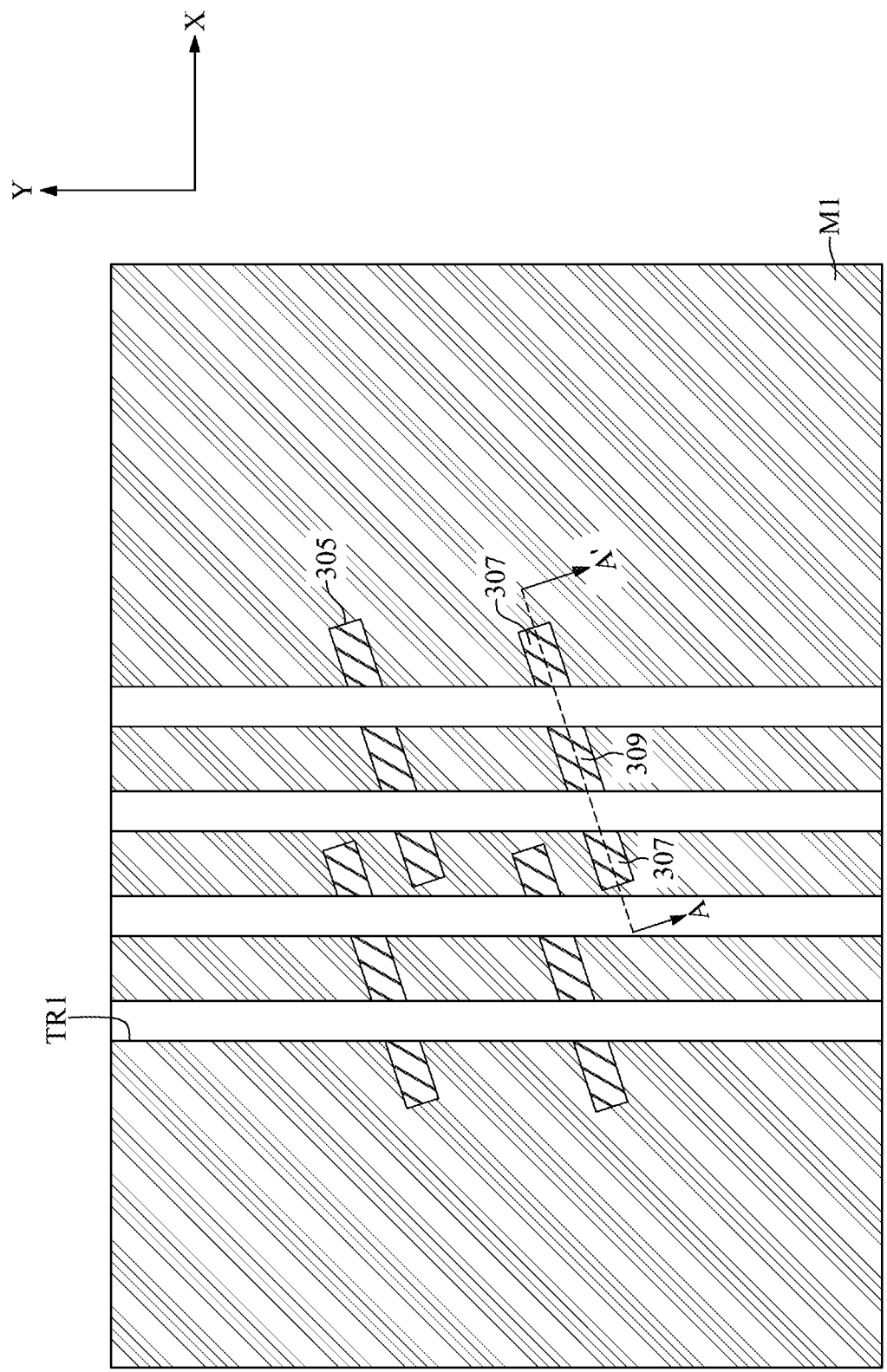
FIG. 6 illustrates, in a schematic top-view diagram, an intermediate semiconductor device in accordance with one embodiment of the present disclosure.
Figure 7:
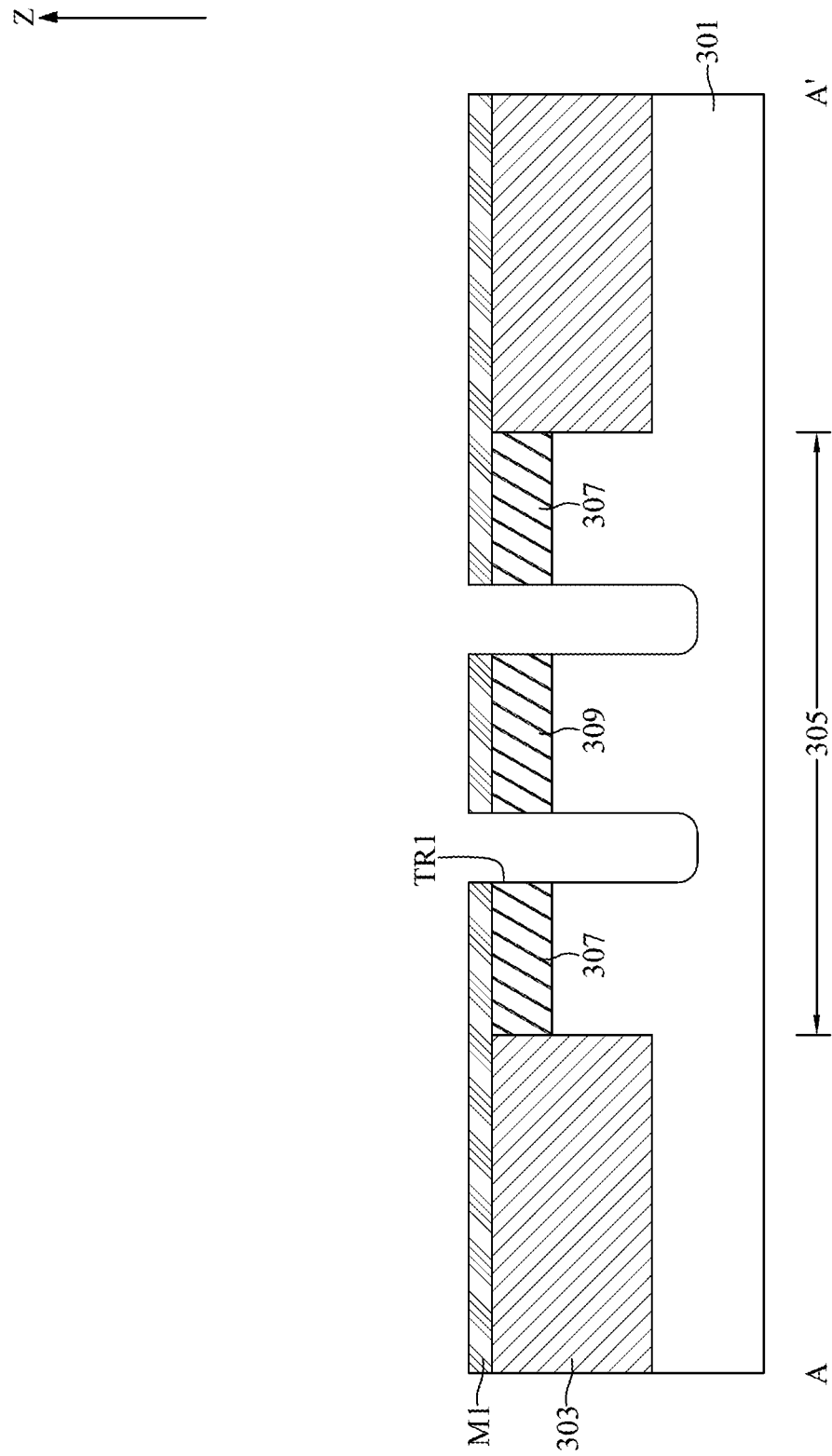
FIG. 7 is a schematic cross-sectional view diagram taken along a line A-A' in FIG. 6.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2. FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4. FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6.

With reference to FIGS. 1 to 7, at step S11, a substrate 301 may be provided, an isolation layer 303 may be formed in the substrate 301 to define a plurality of active areas 305, a plurality of impurity layers 401 may be formed in the plurality of active areas 305, and a plurality of word line trenches TR1 may be formed in the substrate 301 to turn the plurality of impurity layers 401 into a plurality of drain regions 307 and a plurality of source regions 309.

With reference to FIGS. 2 and 3, the substrate 301 may include a silicon-containing material. Illustrative examples of silicon-containing materials suitable for the substrate 301 may include, but are not limited to, silicon, silicon germanium, carbon doped silicon germanium, silicon germanium carbide, carbon-doped silicon, silicon carbide, and multi-layers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

In some embodiments, the substrate 301 may include a semiconductor-on-insulator structure which consisting of, from bottom to top, a handle substrate, an insulator layer, and a topmost semiconductor material layer. The handle substrate and the topmost semiconductor material layer may be formed of a same material such as bulk silicon, or other suitable semiconductor material. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

With reference to FIGS. 2 and 3, a series of deposition processes may be performed to deposit a pad oxide layer (not shown for clarity) and a pad nitride layer (not shown for clarity) on the substrate 301. A photolithography process may be performed to define the position of the isolation layer 303. After the photolithography process, an etch process, such as an anisotropic dry etch process, may be performed to form trenches penetrating through the pad oxide layer, the pad nitride layer, and the substrate 301. An insulating material may be deposited into the trenches and a planarization process, such as chemical mechanical polishing, may be subsequently performed to remove excess filling material until the substrate 301 is exposed. The insulating material may be, for example, silicon oxide, silicon nitride, silicon oxynitride, silicon nitride oxide, the like, or a combination thereof.

With reference to FIGS. 2 and 3, the isolation layer 303 may define positions of the plurality of active areas 305. For brevity, clarity, and convenience of description, only one active area 305 is described. The active area 305 may comprise a portion of the substrate 301 and a space above the portion of the substrate 301. Describing an element as being disposed on the active area 305 means that the element is disposed on a top surface of the portion of the substrate 301. Describing an element as being disposed in the active area 305 means that the element is disposed in the portion of the substrate 301; however, a top surface of the element may be even with the top surface of the portion of the substrate 301. Describing an element as being disposed above the active area 305 means that the element is disposed above the top surface of the portion of the substrate 301. In a top-view perspective, the active area 305 may be arranged in parallel to a direction slanted with respective to the direction X and the direction Y.

With reference to FIGS. 4 and 5, the plurality of impurity layers 401 may be formed in the plurality of active areas 305, respectively and correspondingly. For brevity, clarity, and convenience of description, only one impurity layer 401 is described. The impurity layer 401 may be formed in the substrate 301. The top surface of the impurity layer 401 may be substantially coplanar with the top surface of the substrate 301. The impurity layer 401 may be formed by an n-type impurity or a p-type impurity implantation process. The n-type impurity implantation process may add impurities that contribute free electrons to an intrinsic semiconductor. In a silicon-containing substrate, examples of n-type dopants, i.e., impurities, include but are not limited to antimony, arsenic, or phosphorous. The p-type impurity implantation process may add impurities to an intrinsic semiconductor that creates deficiencies of valence electrons. In a silicon-containing substrate, examples of p-type dopants, i.e., impurities include but are not limited to boron, aluminum, gallium, or indium. The dopant concentration of the impurity region 103 may be between about 1E17 atoms/cm^3 and between about 1E18 atoms/cm^3.

In some embodiments, an annealing process may be performed to activate the impurity layer 401. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIGS. 6 and 7, a first mask layer M1 may be formed on the substrate 301. A photolithography process may be performed to define the position of the plurality of word line trenches TR1. An etch process, such as an anisotropic dry etch process, may be performed to remove the substrate 301, the isolation layer 303, and the impurity layer 401 and concurrently form the plurality of word line trenches TR1. The plurality of word line trenches TR1 may be arranged in parallel to the direction Y. The bottom surfaces of the plurality of word line trenches TR1 may be at a vertical level higher than a vertical level of the bottom surface of the isolation layer 303. Each active area 305 may be crossed by two word line trenches TR1. The two word line trenches TR1 may divide the impurity layer 401 into two drain regions 307 and a source region 309 positioned between the two drain regions 307.

Figure 8:
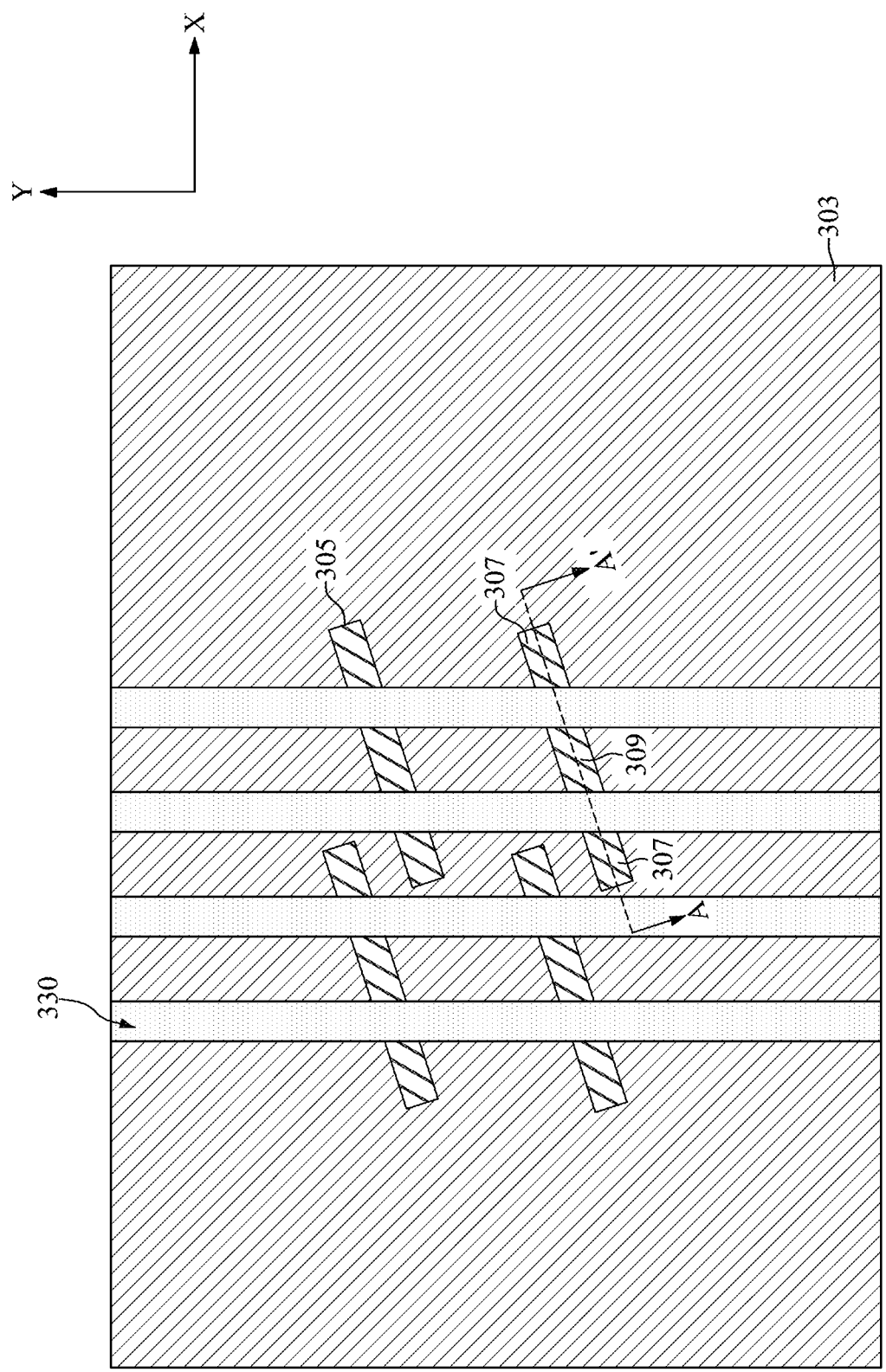
FIG. 8 illustrates, in a schematic top-view diagram, an intermediate semiconductor device in accordance with one embodiment of the present disclosure.
Figure 9:
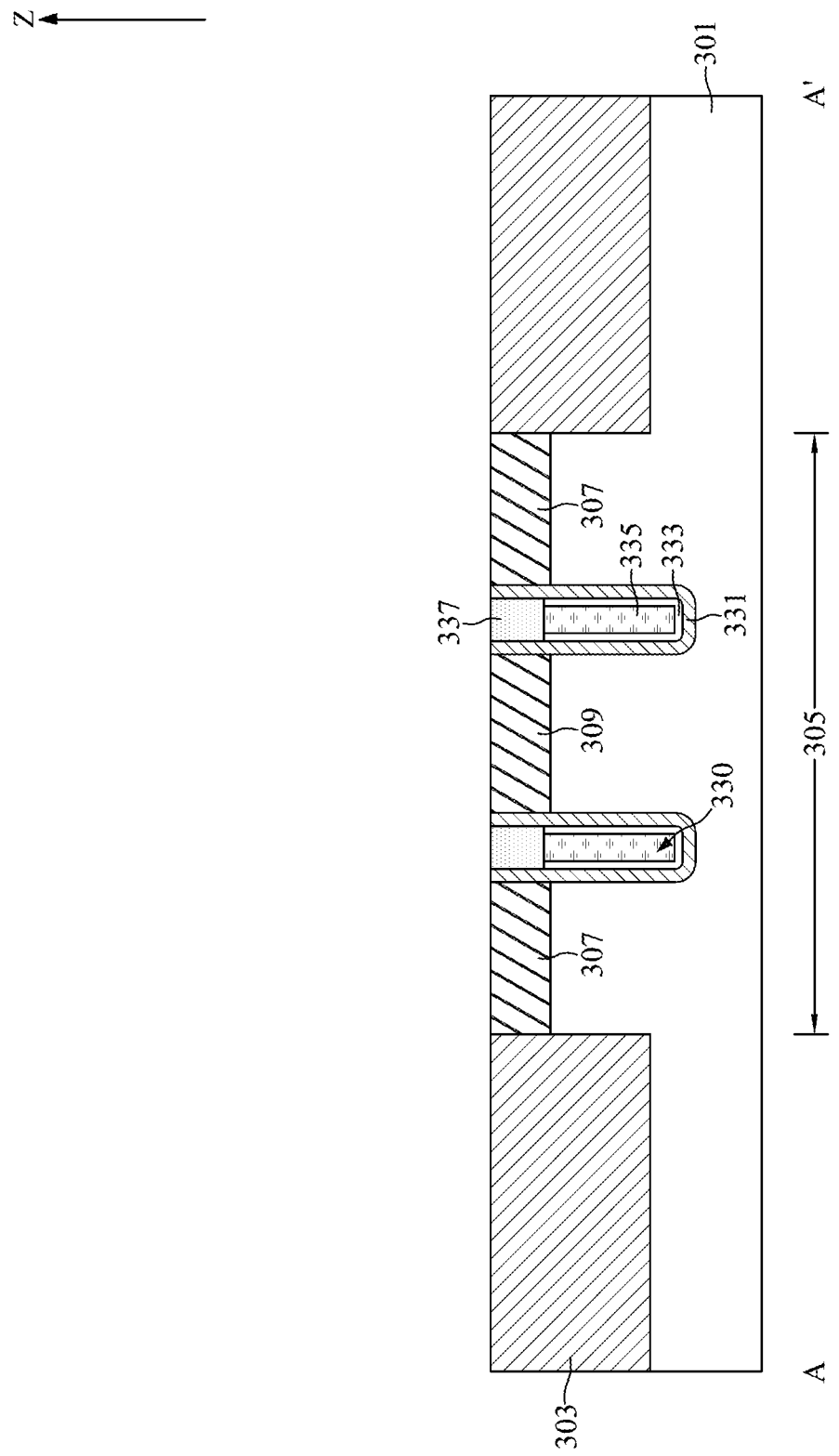
FIG. 9 is a schematic cross-sectional view diagram taken along a line A-A' in FIG. 8.

FIG. 8 illustrates, in a schematic top-view diagram, an intermediate semiconductor device in accordance with one embodiment of the present disclosure. FIG. 9 is a schematic cross-sectional view diagram taken along a line A-A' in FIG. 8.

With reference to FIGS. 1, 8, and 9, at step S13, a plurality of word lines 330 may be formed in the plurality of word line trenches TR1.

For brevity, clarity, and convenience of description, only one word line 330 is described.

With reference to FIGS. 8 and 9, the word line 330 may be formed in the word line trench TR1. That is, the word line 330 may be arranged in parallel to the direction Y. The word line 330 may include a word line dielectric layer 331, a word line conductive layer 333, a word line filler layer 335, and a word line capping layer 337.

An insulation layer, which will be turned into the word line dielectric layer 331 later, may be conformally formed on the first mask layer M1 and in the plurality of word line trenches TR1. The insulation layer may have a thickness between about 0.5 nm and about 5.0 nm. In some embodiments, the thickness of the insulation layer may be between about 0.5 nm and about 2.5 nm. The insulation layer may include, for example, one or more of a silicon oxide layer, a silicon nitride layer, a silicon oxynitride layer, and a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

In some embodiments, the high-k dielectric material may be, for example, hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

A conductive layer, which will be turned into the word line conductive layer 333 later, may be conformally formed on the insulation layer. The conductive layer may have a thickness between about 10 angstroms and about 200 angstroms. The conductive layer may include, for example, one or more of conductive metal nitride (e.g., titanium nitride or tantalum nitride).

The insulation layer and the conductive layer may be formed by, for example, atomic layer deposition process. The atomic layer deposition process alternately supplies two (or more) different source gases one by one onto a process object under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality dielectric film or conductive film is formed on the process object.

A conductive material such as titanium, tantalum, tungsten, copper, or aluminum may be deposited to completely fill the word line trench TR1. Subsequently, an etch back process may be performed to remove portion of the conductive material and the conductive layer. After the etch back process, the remained conductive layer may be referred to as the word line filler layer 335. The remained conductive layer may be referred to as the word line conductive layer 333. The insulation layer may be referred to as the word line dielectric layer 331.

In some embodiments, the word line dielectric layer 331 and the word line conductive layer 333 may have a U-shaped cross-sectional profile. Corner effects may be avoided if the word line dielectric layer 331 and the word line conductive layer 333 have a U-shape cross-sectional profile. In some embodiments, the bottom surface of the word line dielectric layer 331 may be flat. In some embodiments, the bottom surface of the word line dielectric layer 331 may be rounded to reduce defect density and reduce electric field concentration during the operating of the semiconductor device 1A. The word line dielectric layer 331 may prevent junction leakage and prevent dopants in the drain regions 307 and the source region 309 from migrating into the word line conductive layer 333 and the word line filler layer 335.

In some embodiments, the top surface of the word line filler layer 335 and the top surface of the word line conductive layer 333 may be substantially coplanar. In some embodiments, the top surface of the word line filler layer 335 may be at a vertical level lower than a vertical level of the top surface of the word line dielectric layer 331.

Next, a capping material may be deposited to fill the word line trench TR1. A planarization process, such as chemical mechanical polishing, may be performed until the top surface of the isolation layer 303 is exposed to remove excess material, provide a substantially flat surface for subsequent processing steps, and concurrently form the word line capping layer 337. The capping material may be, for example, silicon oxide, silicon nitride, silicon oxynitride, silicon nitride oxide, or a high-k dielectric material.

Figure 10:
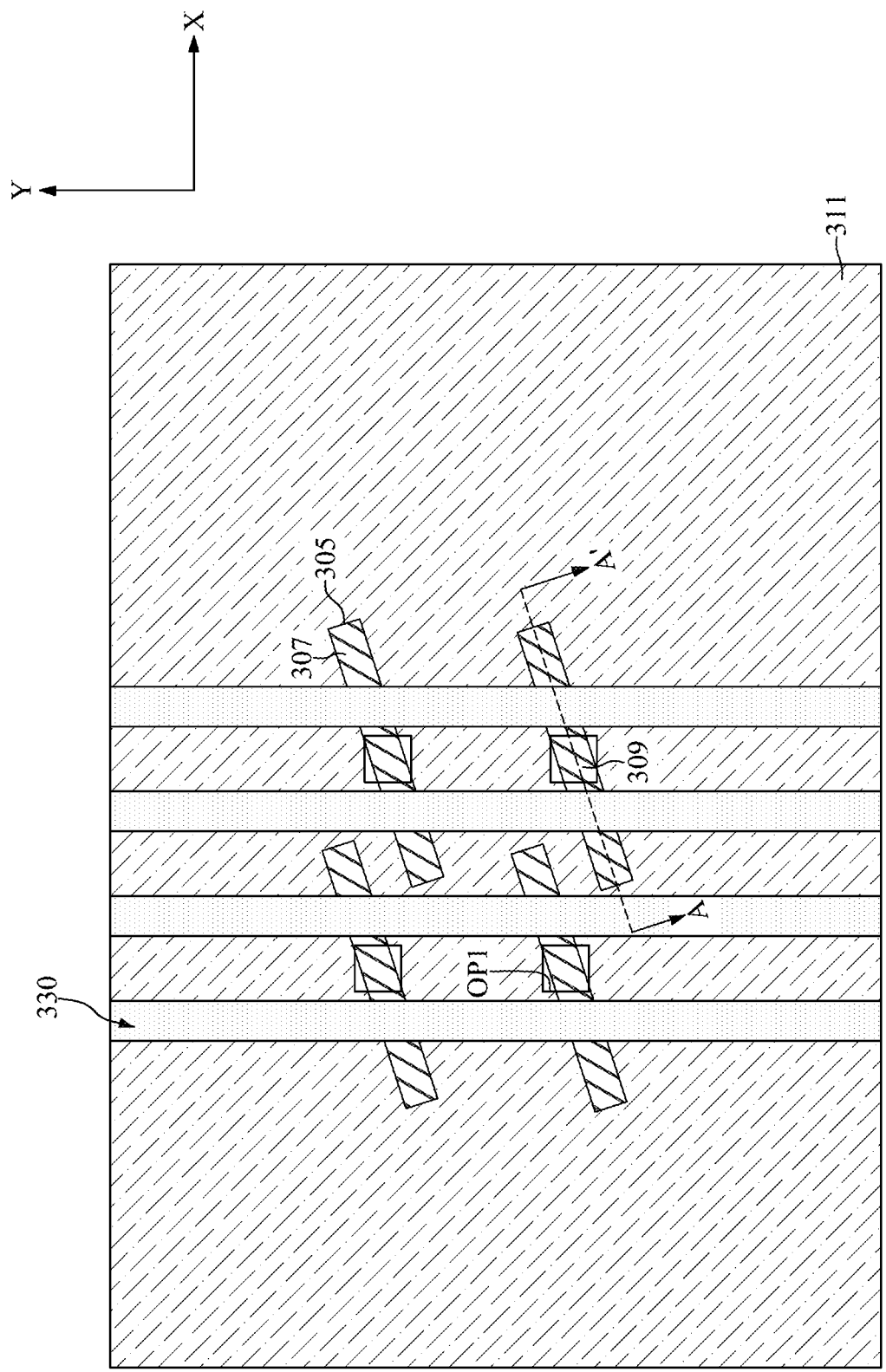
FIG. 10 illustrates, in a schematic top-view diagram, an intermediate semiconductor device in accordance with one embodiment of the present disclosure.
Figure 11:
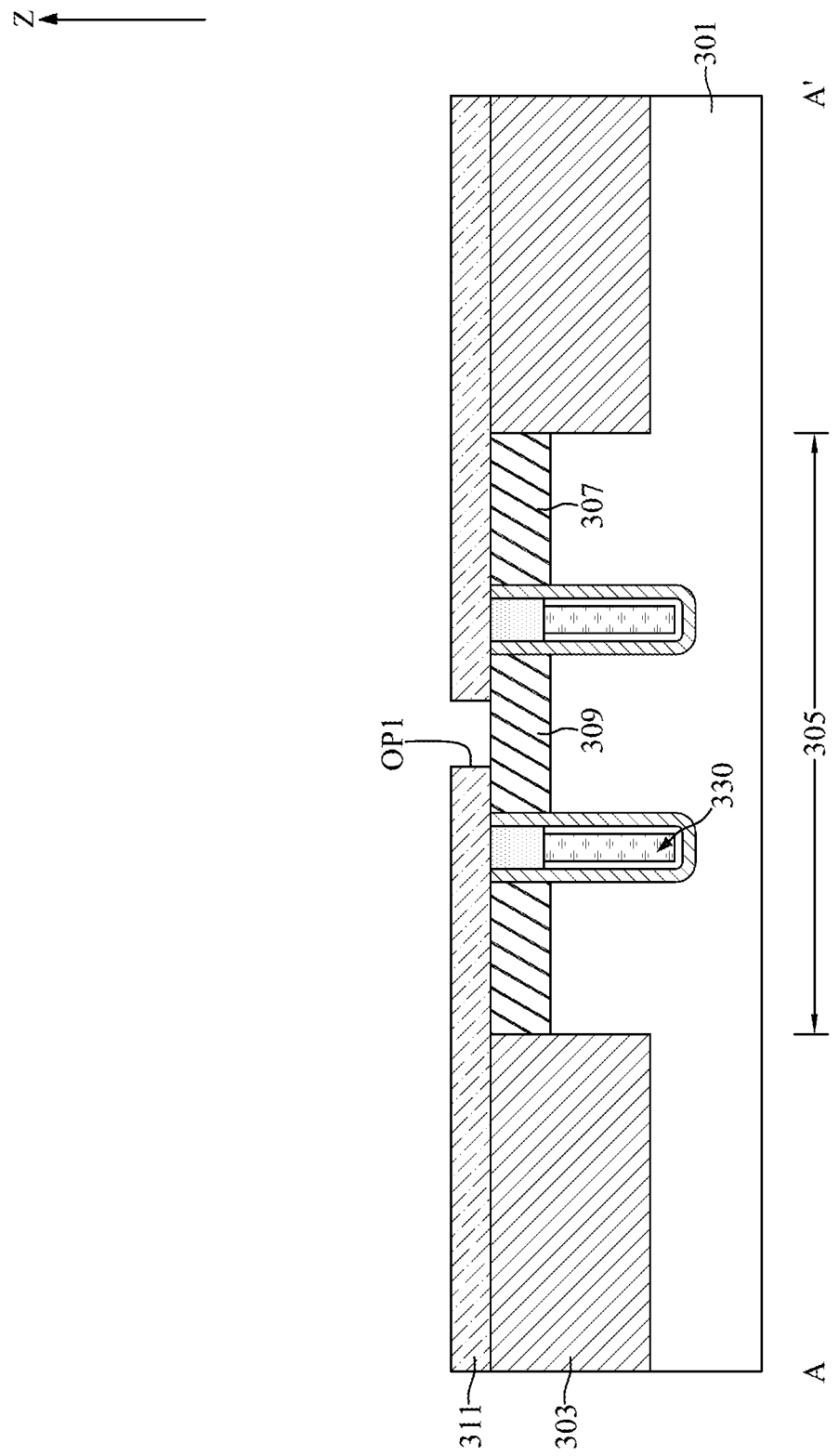
FIG. 11 is a schematic cross-sectional view diagram taken along a line A-A' in FIG. 10.
Figure 12:
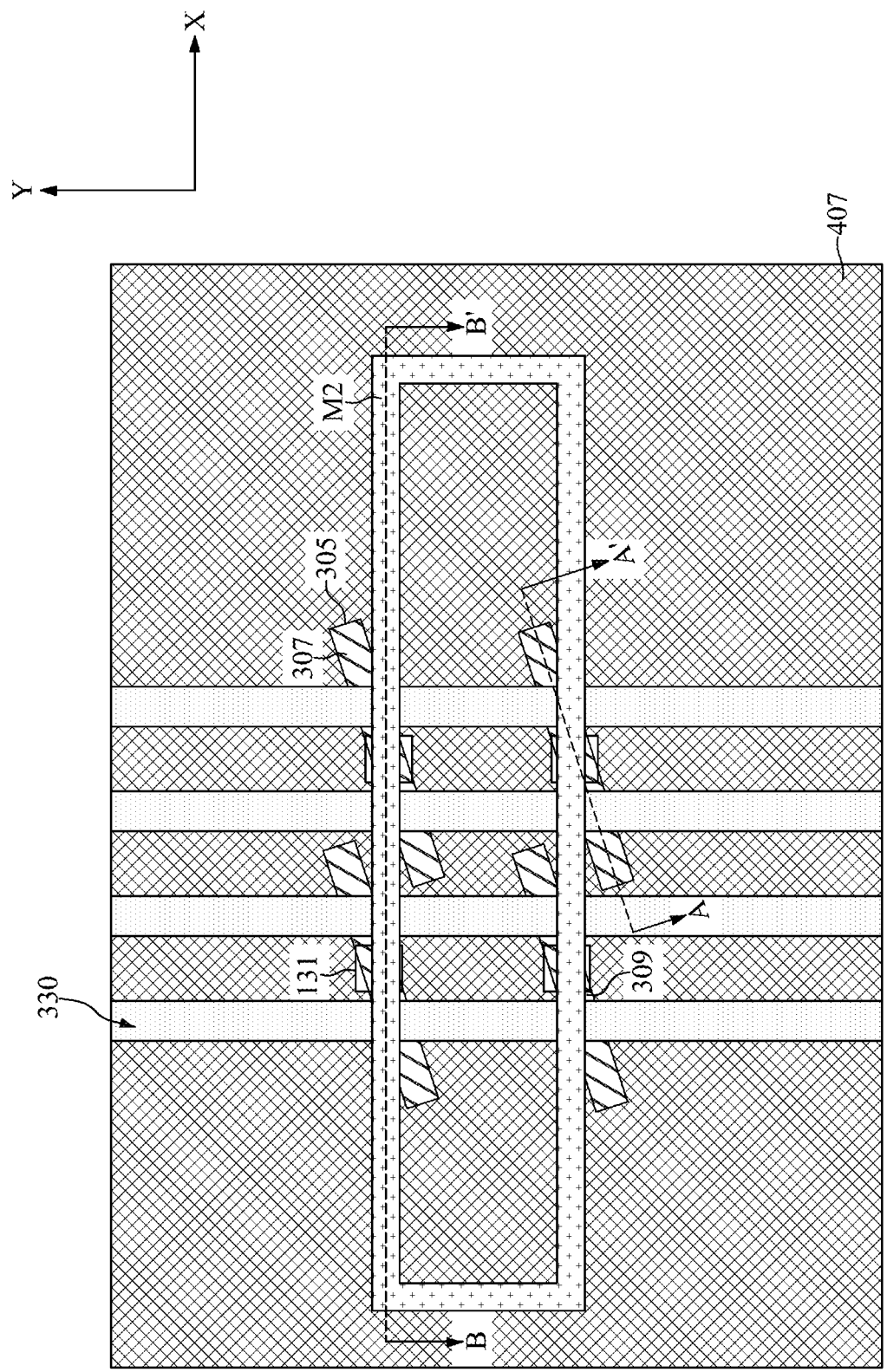
FIG. 12 illustrates, in a schematic top-view diagram, an intermediate semiconductor device in accordance with one embodiment of the present disclosure.
Figure 13:
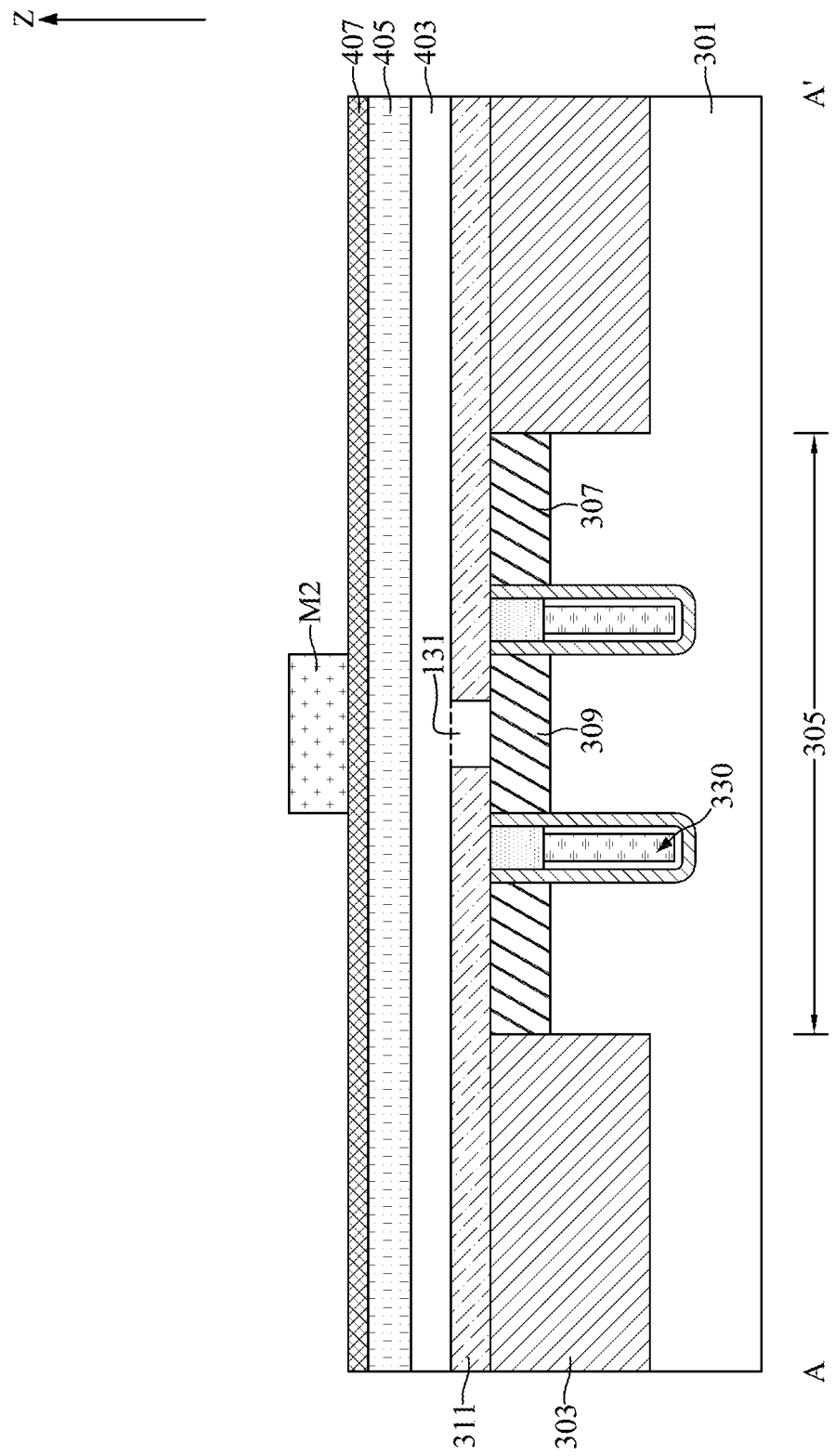
FIG. 13 is a schematic cross-sectional view diagram taken along a line A-A' in FIG. 12.
Figure 14:
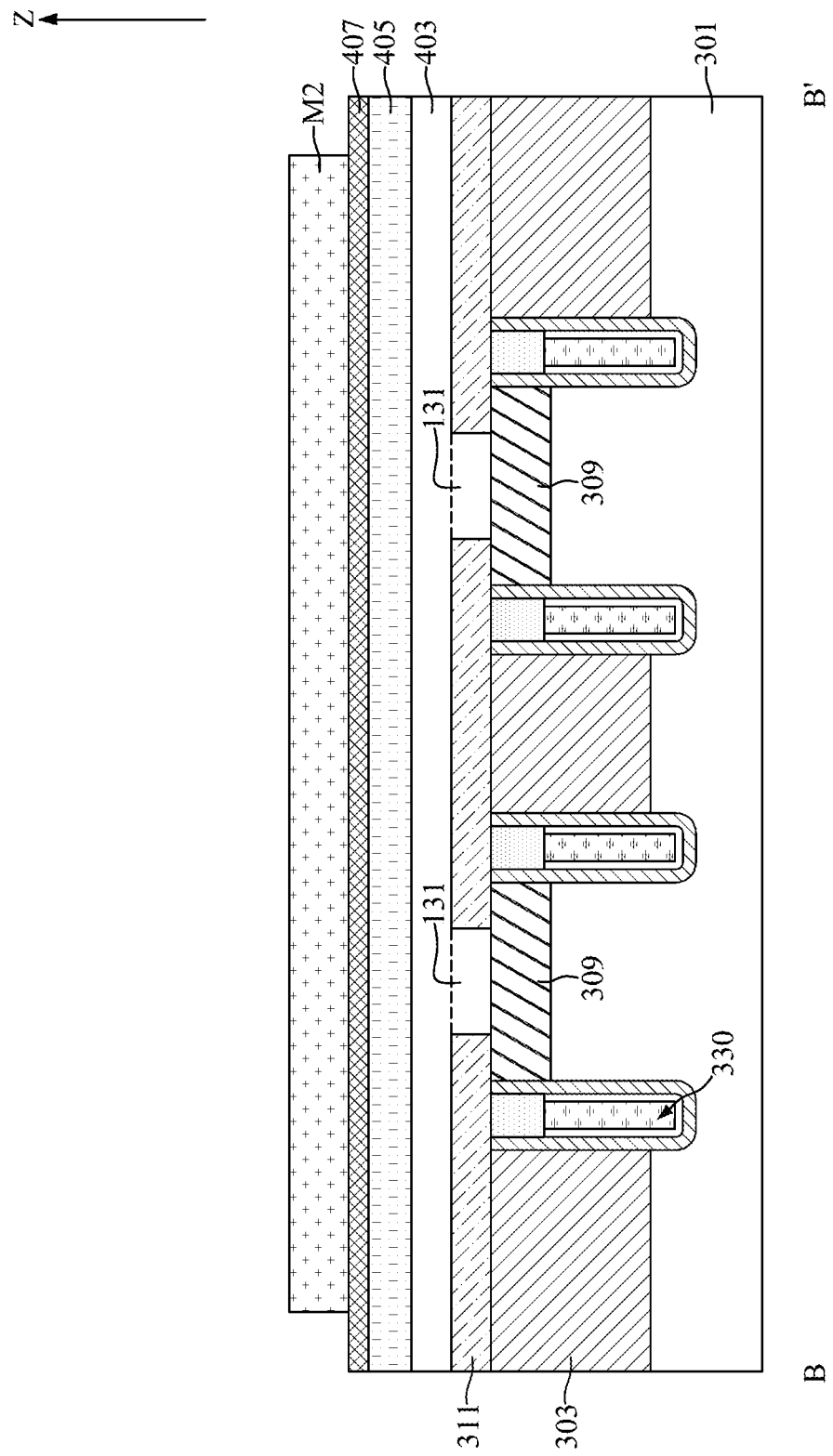
FIG. 14 is a schematic cross-sectional view diagram taken along a line B-B' in FIG. 12.
Figure 15:
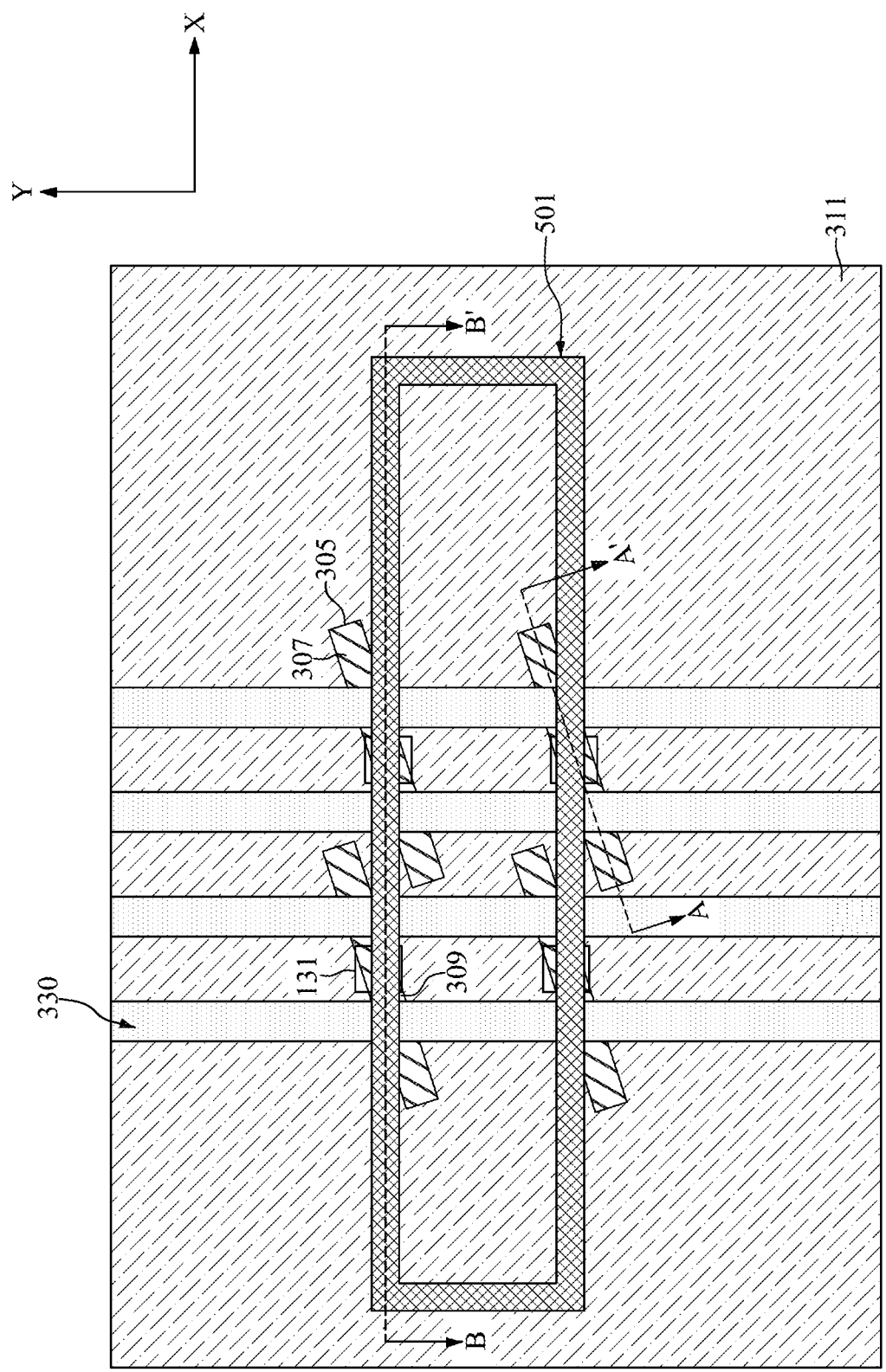
FIG. 15 illustrates, in a schematic top-view diagram, an intermediate semiconductor device in accordance with one embodiment of the present disclosure.
Figure 16:
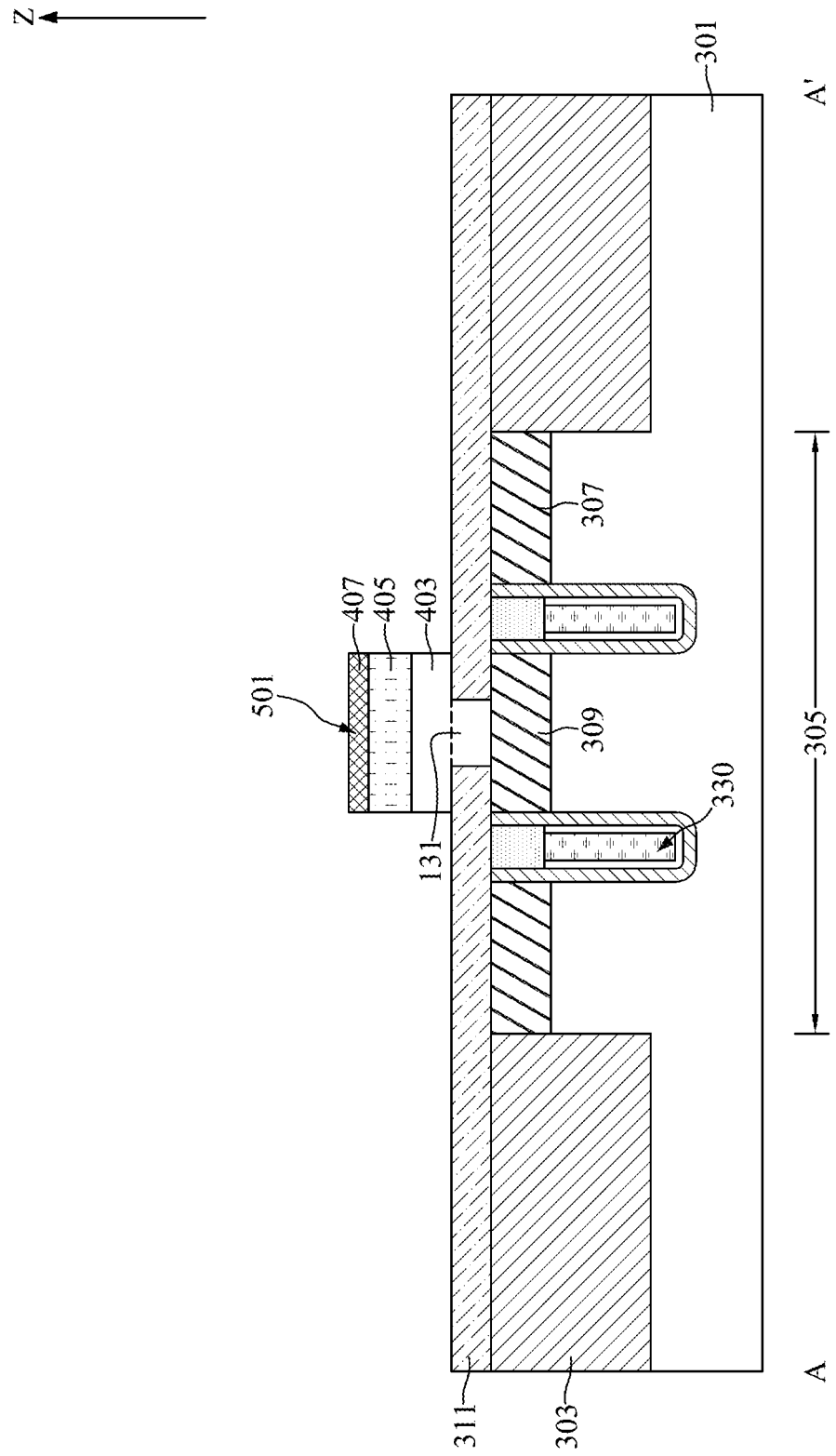
FIG. 16 is a schematic cross-sectional view diagram taken along a line A-A' in FIG. 15.
Figure 17:
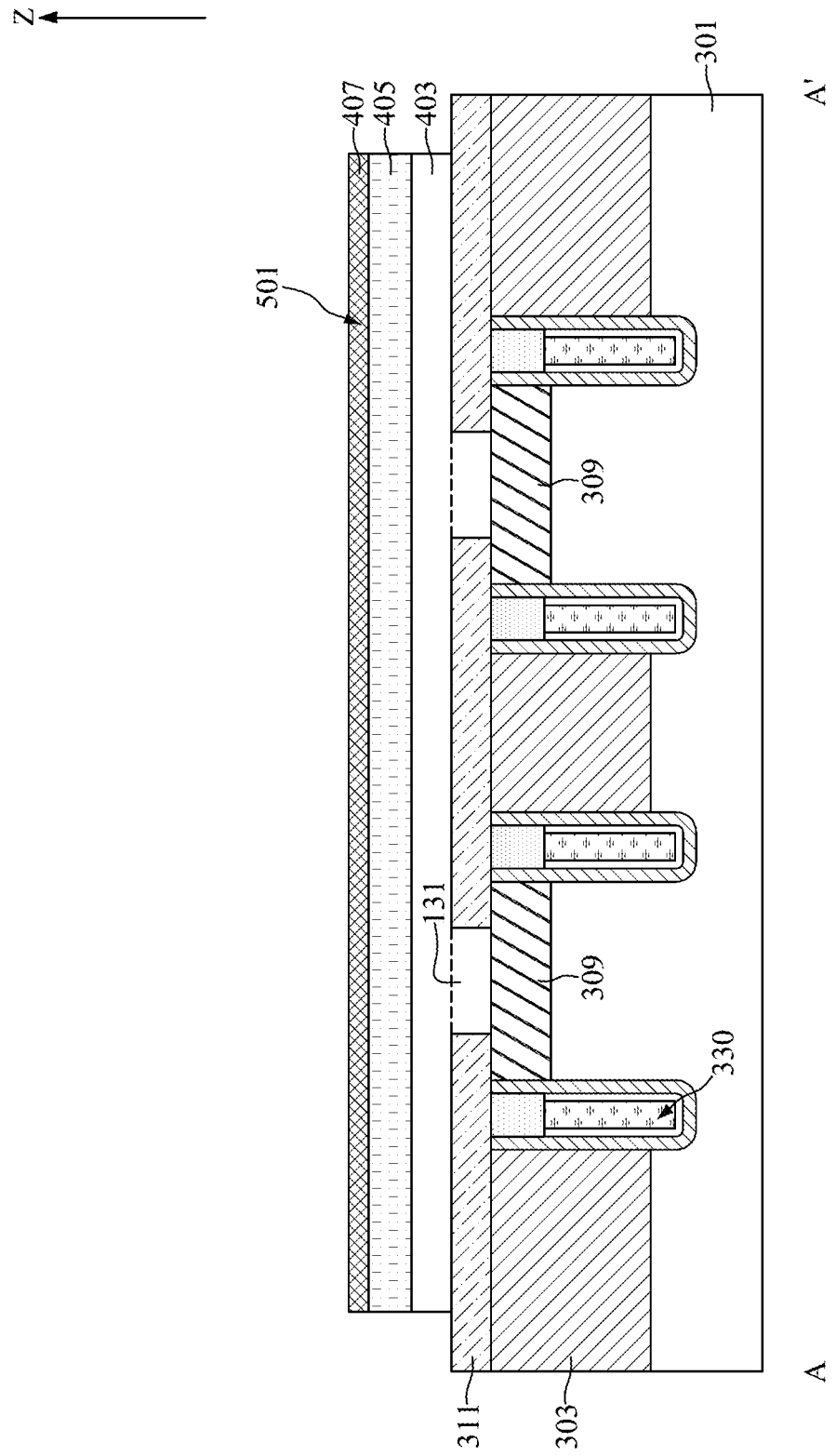
FIG. 17 is a schematic cross-sectional view diagram taken along a line B-B' in FIG. 15.
Figure 18:
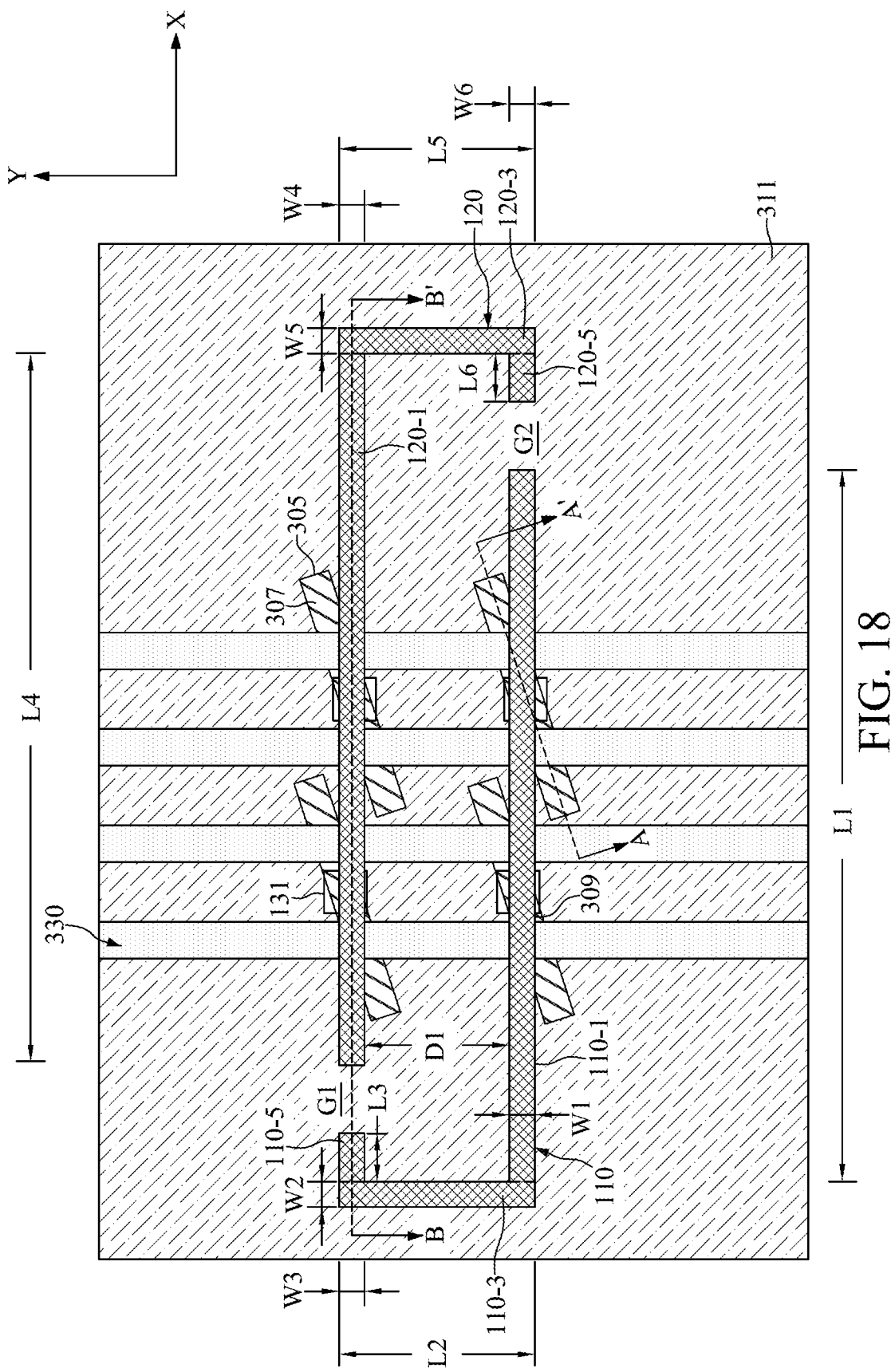
FIG. 18 illustrates, in a schematic top-view diagram, an intermediate semiconductor device in accordance with one embodiment of the present disclosure.
Figure 19:
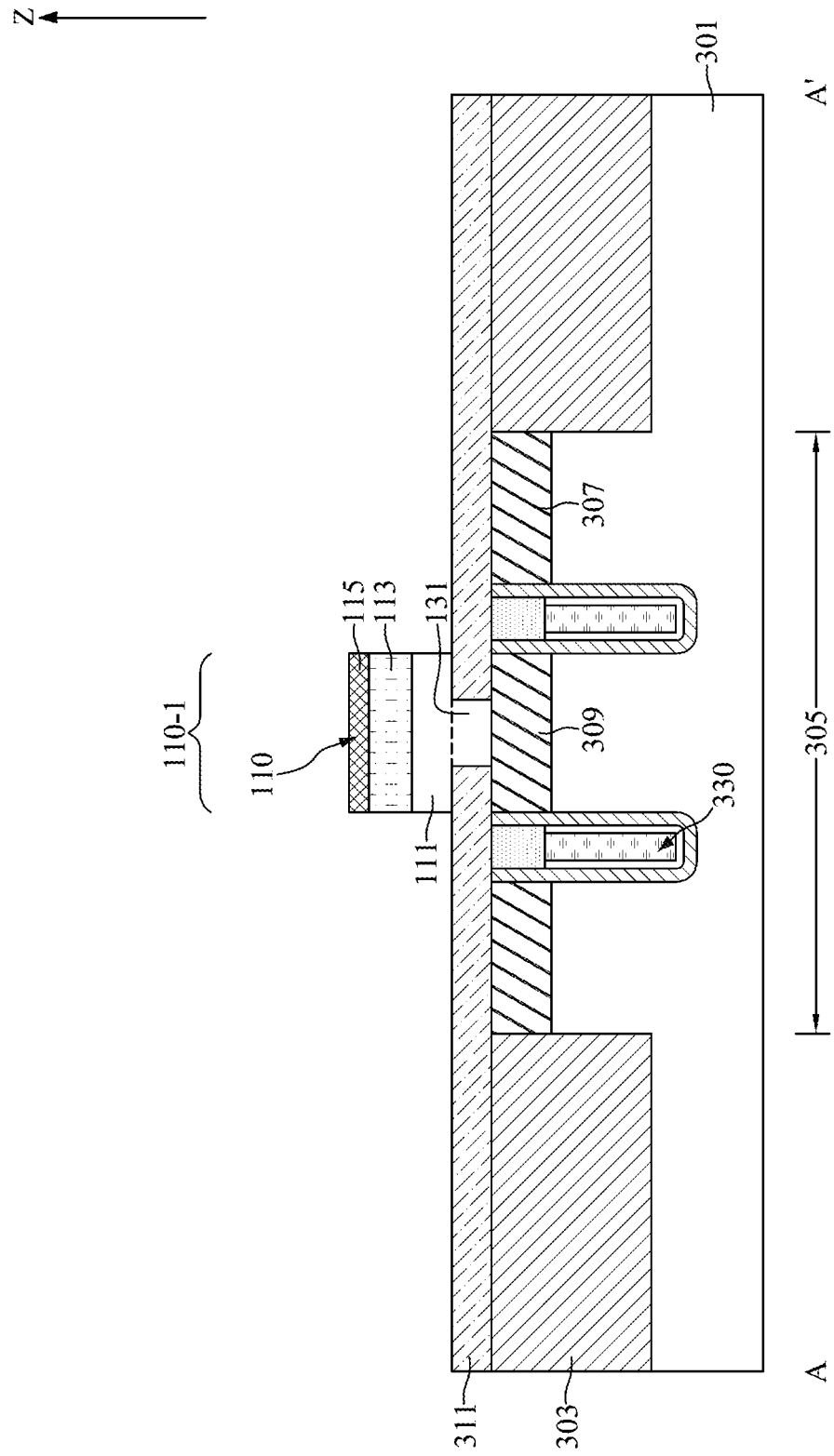
FIG. 19 is a schematic cross-sectional view diagram taken along a line A-A' in FIG. 18.
Figure 20:
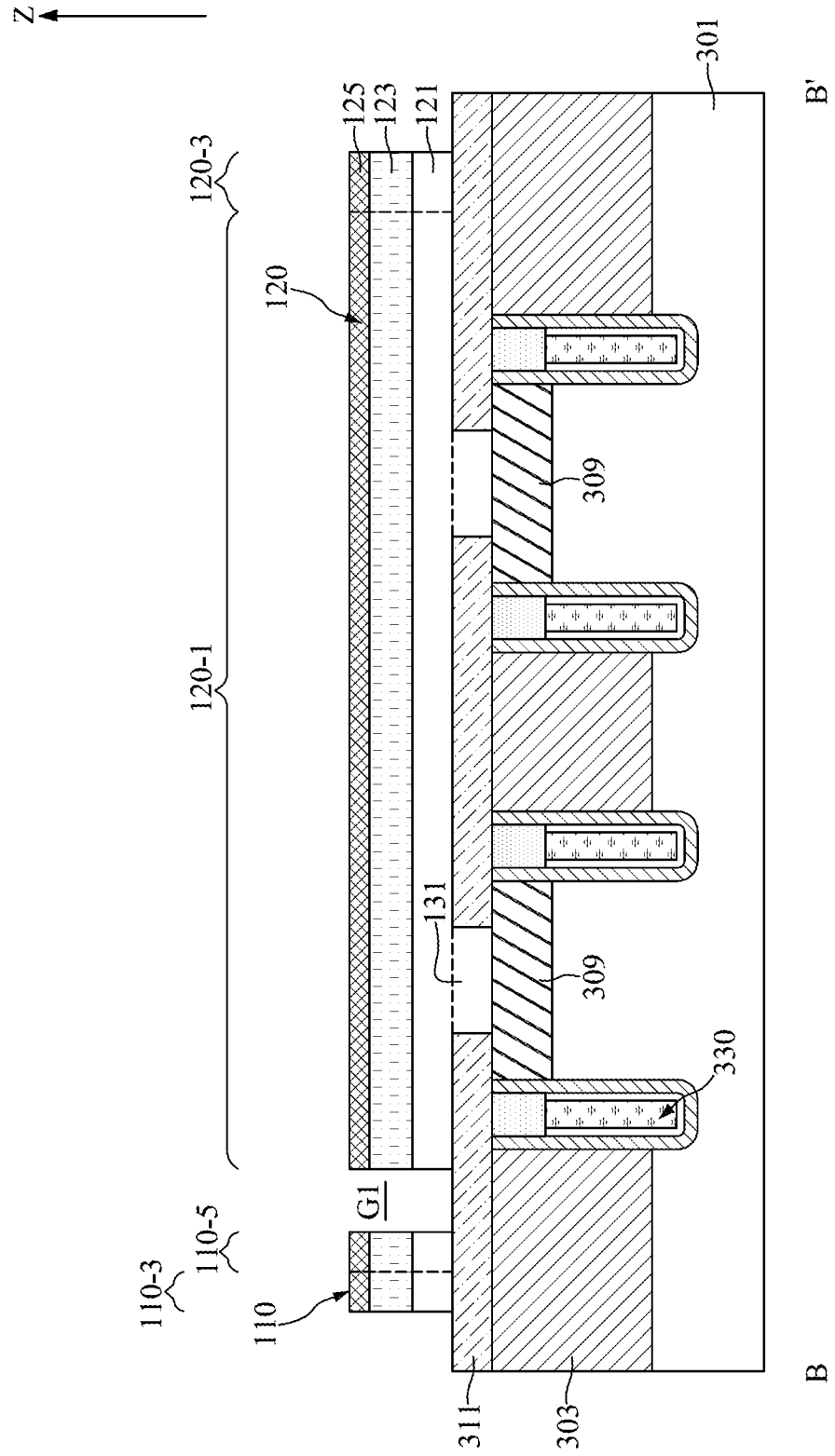
FIG. 20 is a schematic cross-sectional view diagram taken along a line B-B' in FIG. 18.
Figure 21:
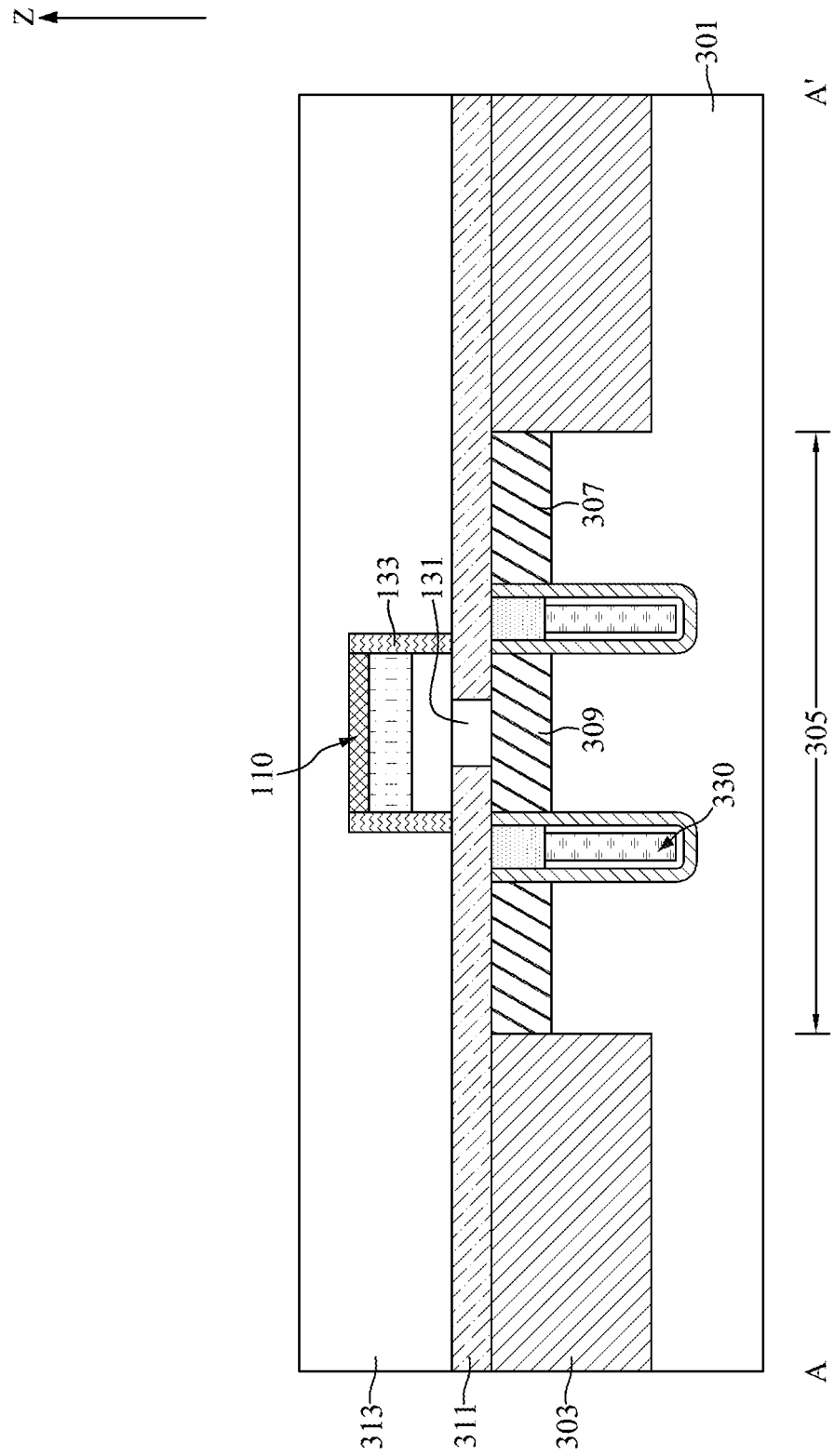
FIGS. 21 and 22 illustrate, in schematic cross-sectional view diagrams, part of a flow for fabricating the semiconductor device in accordance with one embodiment of the present disclosure.
Figure 22:
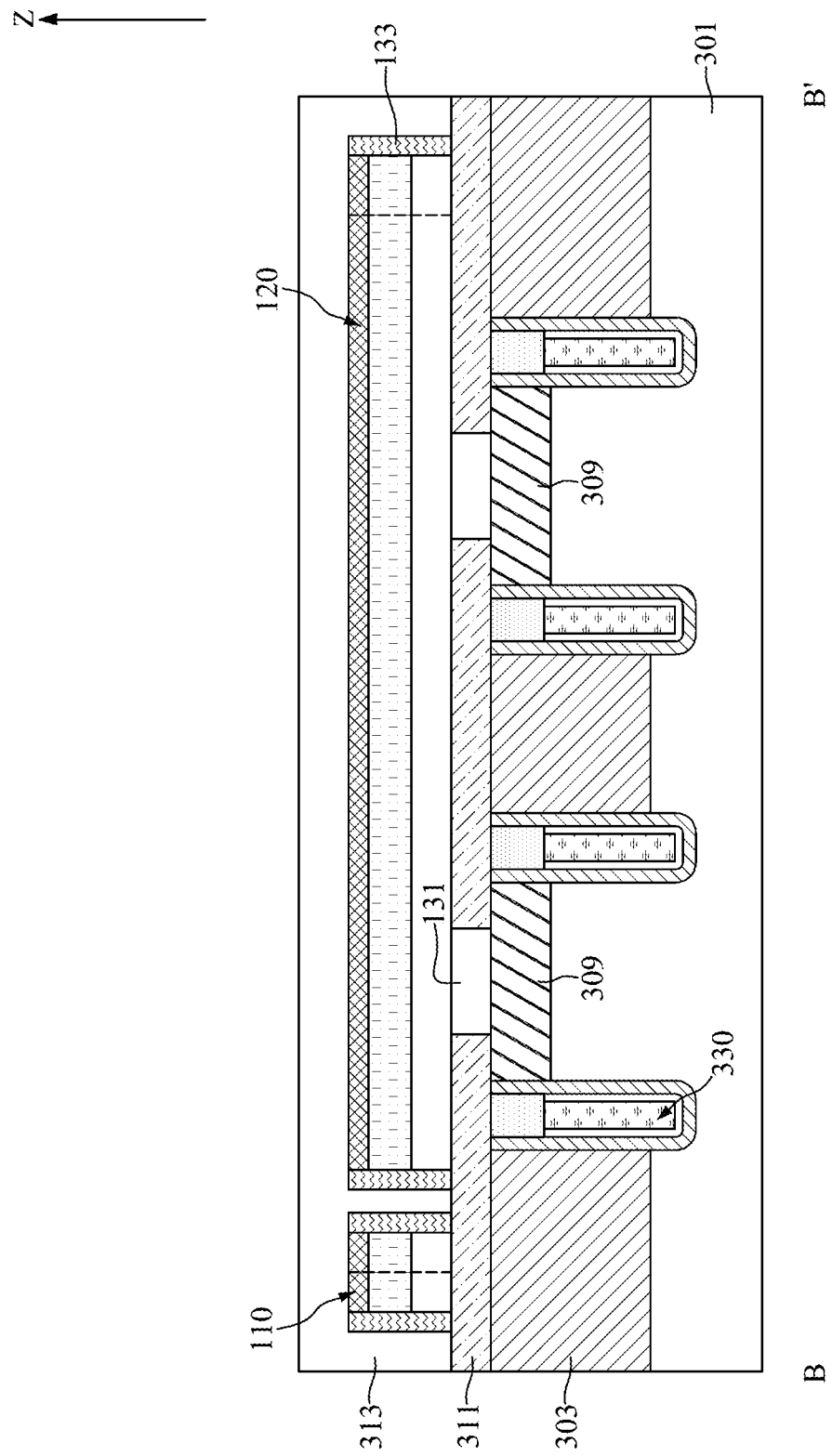

FIG. 10 illustrates, in a schematic top-view diagram, an intermediate semiconductor device in accordance with one embodiment of the present disclosure. FIG. 11 is a schematic cross-sectional view diagram taken along a line A-A' in FIG. 10. FIG. 12 illustrates, in a schematic top-view diagram, an intermediate semiconductor device in accordance with one embodiment of the present disclosure. FIG. 13 is a schematic cross-sectional view diagram taken along a line A-A' in FIG. 12. FIG. 14 is a schematic cross-sectional view diagram taken along a line B-B' in FIG. 12. FIG. 15 illustrates, in a schematic top-view diagram, an intermediate semiconductor device in accordance with one embodiment of the present disclosure. FIG. 16 is a schematic cross-sectional view diagram taken along a line A-A' in FIG. 15. FIG. 17 is a schematic cross-sectional view diagram taken along a line B-B' in FIG. 15. FIG. 18 illustrates, in a schematic top-view diagram, an intermediate semiconductor device in accordance with one embodiment of the present disclosure. FIG. 19 is a schematic cross-sectional view diagram taken along a line A-A' in FIG. 18. FIG. 20 is a schematic cross-sectional view diagram taken along a line B-B' in FIG. 18. FIGS. 21 and 22 illustrate, in schematic cross-sectional view diagrams, part of a flow for fabricating the semiconductor device 1A in accordance with one embodiment of the present disclosure.

With reference to FIG. 1 and FIGS. 10 to 22, at step S15, a first bit line structure 110 and a second bit line structure 120 may be formed to electrically couple to the plurality of source regions 309, a first bit line top contact 210 may be formed to electrically couple to the first bit line structure 110, and a second bit line top contact 220 may be formed to electrically couple to the second bit line structure 120.

With reference to FIGS. 10 and 11, a first dielectric layer 311 may be blanket deposited over the intermediate semiconductor device illustrated in FIGS. 8 and 9. In some embodiments, the first dielectric layer 311 may be an etch stop layer. Generally, the etch stop layer may provide a mechanism to stop an etching process when forming vias and/or contacts. The etch stop layer may preferably formed of a dielectric material having a different etch selectivity from adjacent layers. In some embodiments, the etch stop layer may be formed of silicon nitride, silicon carbonitride, silicon oxycarbon, combinations thereof, or the like. The first dielectric layer 311 may be formed by chemical vapor deposition, plasma-enhanced chemical vapor deposition, or other suitable deposition technique.

With reference to FIGS. 10 and 11, a plurality of first openings OP1 may be formed in the first dielectric layer 311 to expose the plurality of source regions 309. The plurality of first openings OP1 may be formed by a photolithography process with a following etch process. In some embodiments, the sidewalls of the plurality of the first openings OP1 may be substantially vertical. In some embodiments, the sidewalls of the plurality of first openings OP1 may be tapered.

With reference to FIGS. 12 to 14, a layer of first conductive material 403, a layer of second conductive material 405, a layer of first insulation material 407, and a second mask layer M2 may be sequentially formed on the intermediated semiconductor device illustrated in FIGS. 10 and 11. The layer of first conductive material 403 may completely fill the plurality of first openings OP1. The first conductive material 403 filled in the plurality of first openings OP1 may be referred to as a plurality of bit line bottom contacts 131. The first conductive material 403 may be, for example, a doped semiconductor material (e.g., doped silicon or doped germanium), a metallic material (e.g., titanium, tantalum, tungsten, copper, or aluminum), a metal-semiconductor compound (e.g., tungsten silicide, cobalt silicide, or titanium silicide). The second conductive material 405 may be, for example, a metallic material (e.g., titanium, tantalum, tungsten, copper, or aluminum).

In some embodiments, a barrier layer (not shown) may be formed between the layer of first conductive material 403 and the layer of second conductive material 405. The barrier layer may include, for example, titanium nitride, titanium silicon nitride, tantalum nitride, tantalum silicon nitride, or combination thereof. The barrier layer may have a thickness between about 10 angstroms and about 15 angstroms. In some embodiments, the barrier layer may have a thickness between about 11 angstroms and about 13 angstroms.

The first insulation material 407 may be, for example, for example, silicon oxide, silicon nitride, silicon oxynitride, or silicon nitride oxide. In some embodiments, the second mask layer M2 may be a photoresist layer. In a top-view perspective, the second mask layer M2 may have the pattern of a hollow rectangle. The second mask layer M2 may be horizontally arranged in parallel to the direction X and may concurrently cross all the plurality of word lines 330.

With reference to FIGS. 15 to 17, an etch process, such as an anisotropic dry etch process, may be performed to remove portions of the layer of first insulation material 407, the layer of second conductive material 405, and the layer of first conductive material 403 and concurrently form the pre-bit-line structure 501. In a top-view perspective, the pre-bit-line structure 501 may have a hollow rectangle profile. The pre-bit-line structure 501 may be horizontally arranged in parallel to the direction X and may concurrently cross all the plurality of word lines 330.

With reference to FIGS. 18 to 20, a photolithography process using a photoresist layer may be performed to define the pattern of the first bit line structure 110 and the second bit line structure 120. An etch process, such as an anisotropic dry etch process, may be performed to remove portions of the pre-bit-line structure 501 and concurrently form the first bit line structure 110 and the second bit line structure 120.

With reference to FIGS. 18 to 20, the first bit line structure 110 may include a first line portion 110-1, a second line portion 110-3, and a third line portion 110-5 in a top-view perspective. In some embodiments, the first bit line structure 110 may only include the first line portion 110-1 and the second line portion 110-3 in a top-view perspective.

The first line portion 110-1 may be arranged in parallel to the direction X. Some of bit line bottom contacts 131 may be overlapped with the first line portion 110-1 and may be electrically coupled to the first line portion 110-1. In other words, the bit line bottom contacts 131 may be disposed directly under the first line portion 110-1. The first line portion 110-1 may be line shape in a top-view perspective and may include a first end (e.g., the left end in FIG. 18) and a second end (e.g., the right end in FIG. 18) opposite to the first end. The second line portion 110-3 may connect to the first end of the first line portion 110-1 and arranged in parallel to the direction Y. The second line portion 110-3 may be line shape in a top-view perspective and may include two ends such as the lower end and the upper end. The lower end of the second line portion 110-3 is connecting to the first line portion 110-1. The third line portion 110-5 may connect to the upper end of the second line portion 110-3, arranged in parallel to the direction X, and disposed toward to the first line portion 120-1. In other words, the third line portion 110-5 may be arranged in parallel to the first line portion 110-1. The third line portion 110-5 may be distant from the second bit line structure 120 with a first gap G1 interposed therebetween.

In some embodiments, the length L1 of the first line portion 110-1 may be greater than or equal to the length L2 of the second line portion 110-3. In some embodiments, the length L1 of the first line portion 110-1 may be less than the length L2 of the second line portion 110-3. In some embodiments, the length L2 of the second line portion 110-3 may be greater than or equal to the length L3 of the third line portion 110-5. In some embodiments, the length L2 of the second line portion 110-3 may be less than the length L3 of the third line portion 110-5.

In some embodiments, the width W1 of the first line portion 110-1, the width W2 of the second line portion 110-3, and the width W3 of the third line portion 110-5 may be all the same. In some embodiments, the width W1 of the first line portion 110-1, the width W2 of the second line portion 110-3, and the width W3 of the third line portion 110-5 may be all different.

The first bit line structure 110 may include a first bit line bottom layer 111, a first bit line top layer 113, and a first bit line capping layer 115 in a cross-sectional perspective. The first bit line bottom layer 111 may be turned from the layer of first conductive material 403 and may be disposed on some of the bit line bottom contacts 131. The first bit line top layer 113 may be turned from the layer of second conductive material 405 and may be disposed on the first bit line bottom layer 111. The first bit line capping layer 115 may be turned from the layer of first insulation material 407 and may be disposed on the first bit line top layer 113. In some embodiments, the first bit line structure 110 may only include the first bit line bottom layer 111 and the first bit line top layer 113.

With reference to FIGS. 18 to 20, the second bit line structure 120 may include a first line portion 120-1, a second line portion 120-3, and a third line portion 120-5 in a top-view perspective. In some embodiments, the second bit line structure 120 may only include the first line portion 120-1 and the second line portion 120-3.

The first line portion 120-1 may be arranged in parallel to the direction X. In some embodiments, the first line portion 120-1 and the first line portion 110-1 are parallel to each other. Some of bit line bottom contacts 131 may be overlapped with the first line portion 120-1 and may be electrically coupled to the first line portion 120-1. In other words, the bit line bottom contacts 131 may be disposed directly under the first line portion 120-1. The first line portion 120-1 may be line shape in a top-view perspective and may include a first end (e.g., the left end in FIG. 18) and a second end (e.g., the right end in FIG. 18) opposite to the first end. The second line portion 120-3 may connect to the second end of the first line portion 120-1 and arranged in parallel to the direction Y. The second line portion 120-3 may be line shape in a top-view perspective and may include two ends such as the lower end and the upper end. The upper end of the second line portion 120-3 is connecting to the first line portion 120-1. The third line portion 120-5 may connect to the lower end of the second line portion 120-3, arranged in parallel to the direction X, and disposed toward to the first line portion 110-1. In other words, the third line portion 120-5 may be arranged in parallel to the first line portion 120-1. The third line portion 120-5 may be distant from the first bit line structure 110 with a second gap G2 interposed therebetween.

In some embodiments, the length L4 of the first line portion 120-1 may be greater than or equal to the length L5 of the second line portion 120-3. In some embodiments, the length L4 of the first line portion 120-1 may be less than the length L5 of the second line portion 120-3. In some embodiments, the length L5 of the second line portion 120-3 may be greater than or equal to the length L6 of the third line portion 120-5. In some embodiments, the length L5 of the second line portion 120-3 may be less than the length L6 of the third line portion 120-5. In some embodiments, the length L2 of the second line portion 110-3 or the length L5 of the second line portion 120-3 may be less than the distance D1 between the first line portion 110-1 and the first line portion 120-1.

In some embodiments, the width W4 of the first line portion 120-1, the width W5 of the second line portion 120-3, and the width W6 of the third line portion 120-5 may be all the same. In some embodiments, the width W4 of the first line portion 120-1, the width W5 of the second line portion 120-3, and the width W6 of the third line portion 120-5 may be all different.

The second bit line structure 120 may include a second bit line bottom layer 121, a second bit line top layer 123, and a second bit line capping layer 125 in a cross-sectional perspective. The second bit line bottom layer 121 may be turned from the layer of first conductive material 403 and may be disposed on some of the bit line bottom contacts 131. The second bit line top layer 123 may be turned from the layer of second conductive material 405 and may be disposed on the second bit line bottom layer 121. The second bit line capping layer 125 may be turned from the layer of first insulation material 407 and may be disposed on the second bit line top layer 123. In some embodiments, the second bit line structure 120 may only include the second bit line bottom layer 121 and the second bit line top layer 123.

With reference to FIGS. 21 and 22, an insulating material may be conformally formed on the intermediate semiconductor device illustrated in FIGS. 18 to 20. An etch process, such as an anisotropic dry etch process, may be performed to remove portions of the insulating material and concurrently form a plurality of bit line spacers 133 on the sidewalls of the first bit line structure 110 and the sidewalls of the second bit line structure 120. The insulating material may be, for example, silicon nitride, silicon boron carbide nitride, silicon oxy-carbon nitride, silicon carbonitride, silicon carbide oxide, or the like. In some embodiments, the bit line spacers 133 may be optional.

With reference to FIGS. 21 and 22, a second dielectric layer 313 may be formed to cover the first bit line structure 110, the second bit line structure 120, and the plurality of bit line spacers 133. A planarization process, such as chemical mechanical polishing, may be performed to remove excess material and provide a substantially flat surface for subsequent processing steps. In some embodiments, the second dielectric layer 313 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The second dielectric layer 313 may be formed by deposition processes such as chemical vapor deposition, plasma-enhanced chemical vapor deposition, or the like.

Figure 23:
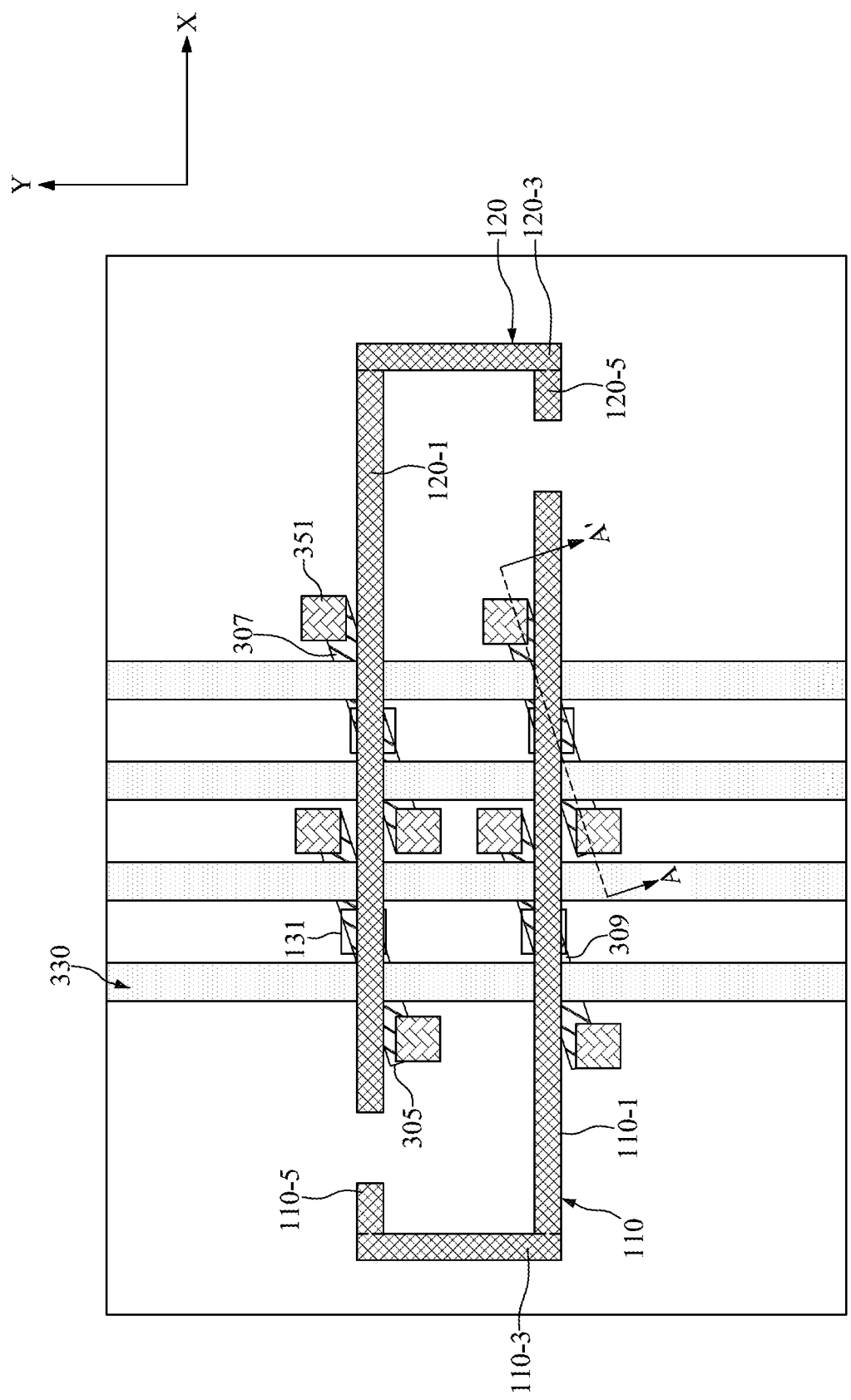
FIG. 23 illustrates, in a schematic top-view diagram, an intermediate semiconductor device in accordance with one embodiment of the present disclosure.
Figure 24:
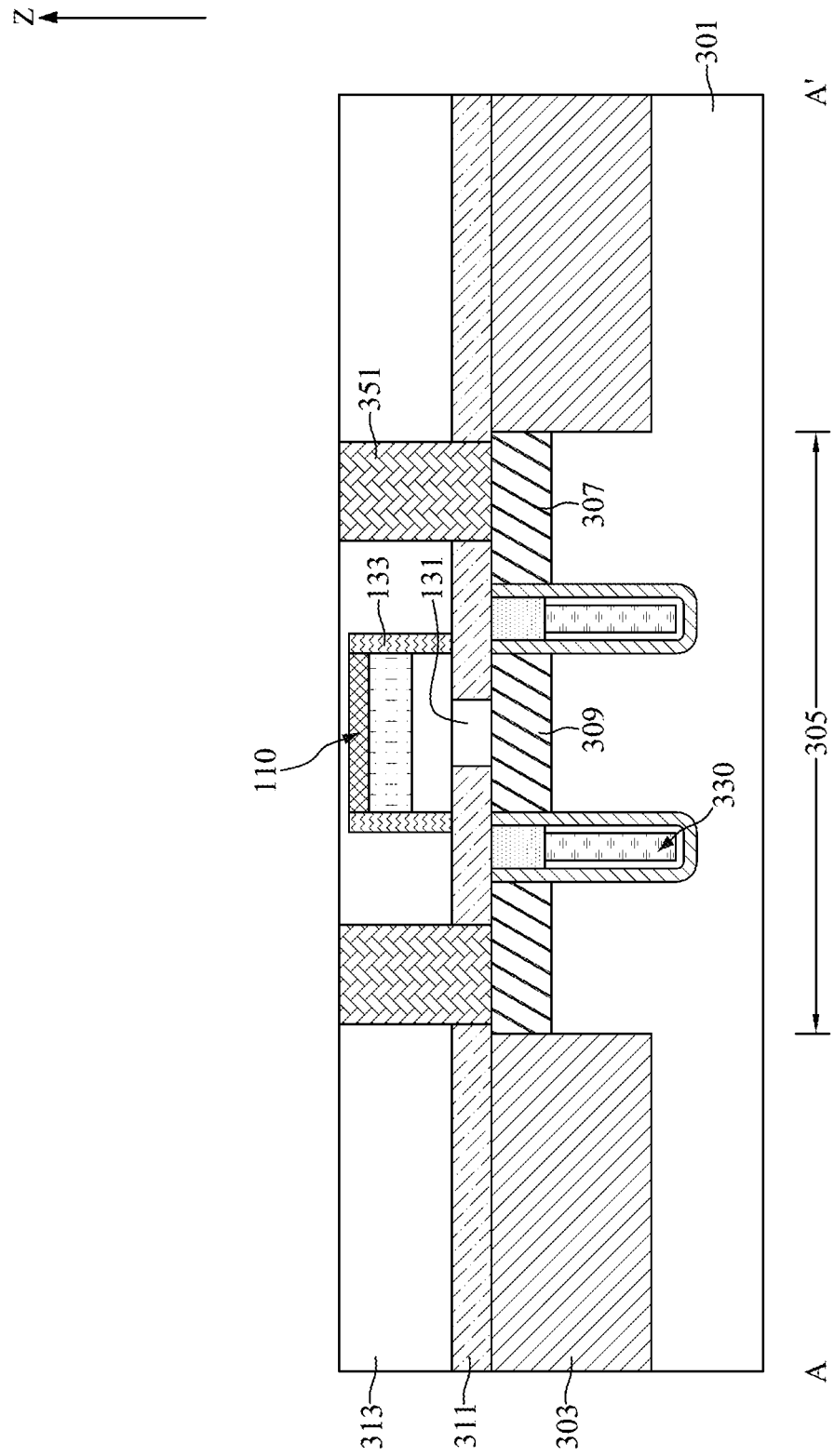
FIG. 24 is a schematic cross-sectional view diagram taken along a line A-A' in FIG. 23.
Figure 25:
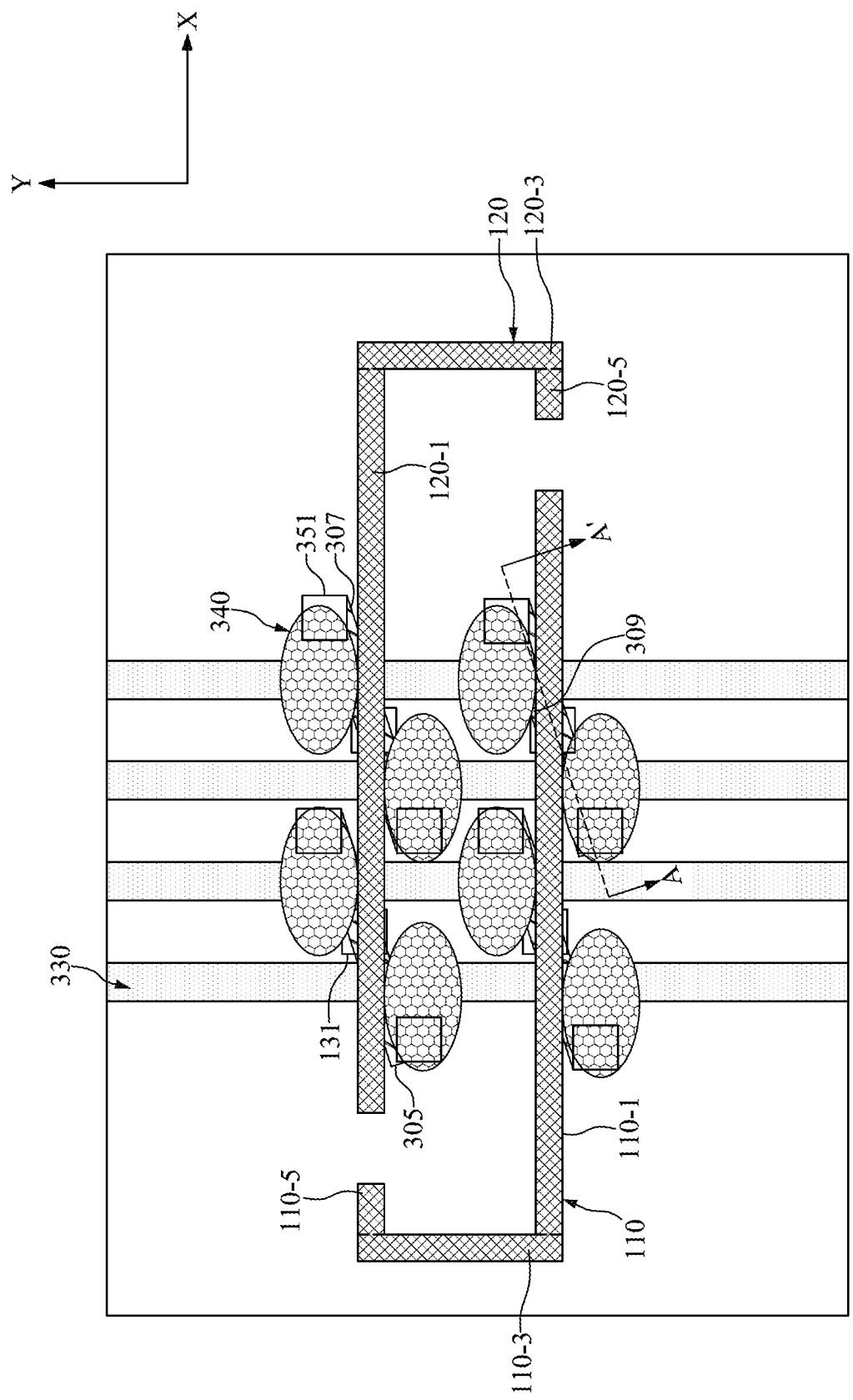
FIG. 25 illustrates, in a schematic top-view diagram, an intermediate semiconductor device in accordance with one embodiment of the present disclosure.
Figure 26:
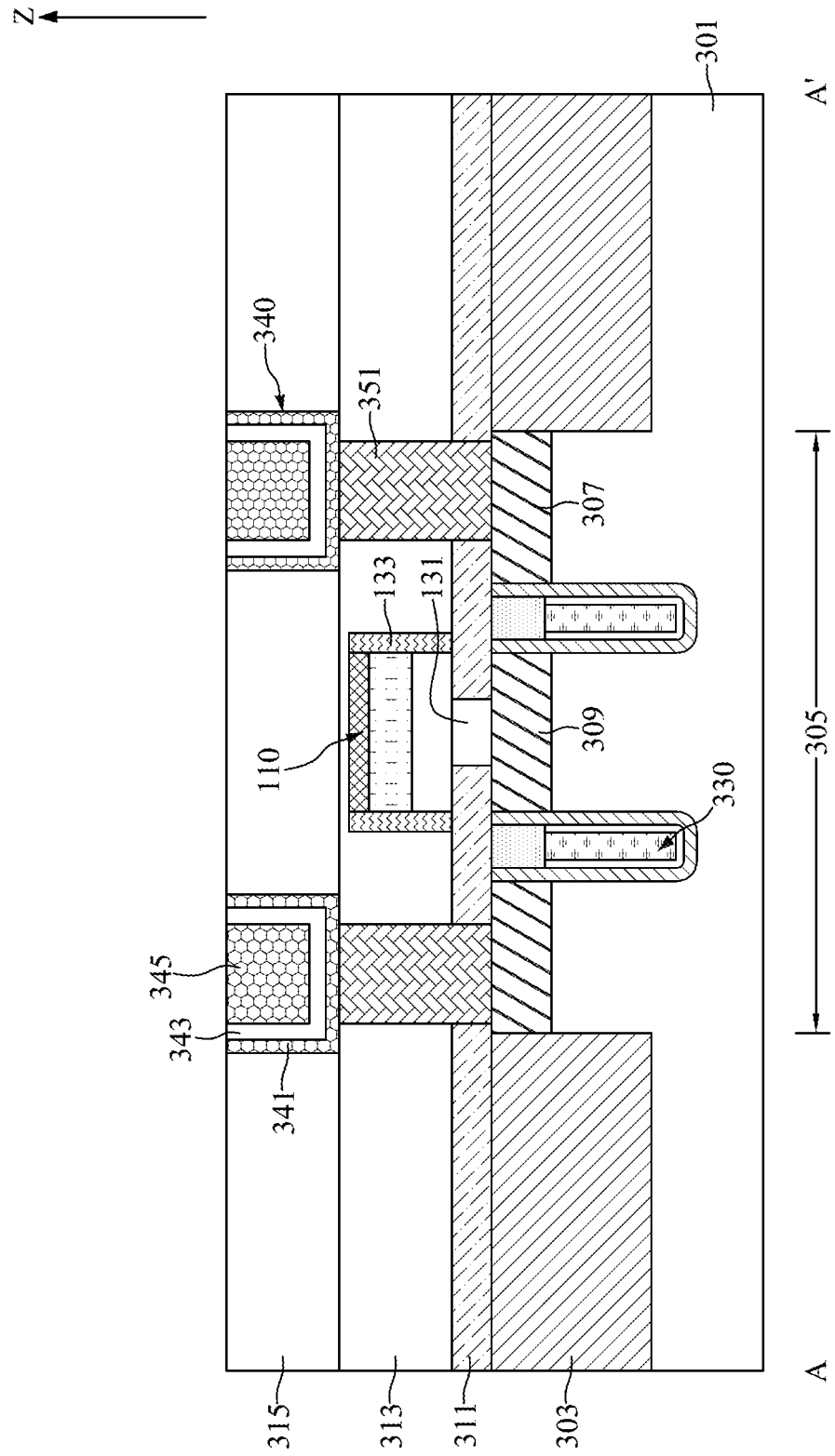
FIG. 26 is a schematic cross-sectional view diagram taken along a line A-A' in FIG. 25.

FIG. 23 illustrates, in a schematic top-view diagram, an intermediate semiconductor device in accordance with one embodiment of the present disclosure. FIG. 24 is a schematic cross-sectional view diagram taken along a line A-A' in FIG. 23. FIG. 25 illustrates, in a schematic top-view diagram, an intermediate semiconductor device in accordance with one embodiment of the present disclosure. FIG. 26 is a schematic cross-sectional view diagram taken along a line A-A' in FIG. 25.

With reference to FIG. 1 and FIGS. 23 to 26, at step S17, a plurality of capacitor contacts 351 may be formed to electrically couple to the plurality of drain regions 307 and a plurality of capacitor structures 340 may be formed to electrically couple to the plurality of capacitor contacts 351.

With reference to FIGS. 23 and 24, the plurality of capacitor contacts 351 may be formed along the second dielectric layer 313 and the first dielectric layer 311 and on the plurality of drain regions 307. The plurality of capacitor contacts 351 may include, for example, one or more of conductive metal nitride (e.g., titanium nitride or tantalum nitride) and metal (e.g., titanium, tantalum, tungsten, copper, or aluminum).

With reference to FIGS. 25 and 26, a third dielectric layer 315 may be formed on the second dielectric layer 313. In some embodiments, the third dielectric layer 315 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The third dielectric layer 315 may be formed by deposition processes such as chemical vapor deposition, plasma-enhanced chemical vapor deposition, or the like.

With reference to FIGS. 25 and 26, the plurality of capacitor structures 340 may be formed in the third dielectric layer 315 and on the plurality of capacitor contacts 351, respectively and correspondingly. For brevity, clarity, and convenience of description, only one capacitor structure 340 is described. The capacitor structure 340 may include a capacitor bottom conductive layer 341, a capacitor dielectric layer 343, and a capacitor top conductive layer 345.

The capacitor bottom conductive layer 341 and the capacitor top conductive layer 345 may respectively have a single layer structure or a multilayer structure including at least one material selected from W, WN, WC, Ti, TiN, Ta, TaN, Ru, Co, Mn, WN, Ni, and NiB. In some embodiments, a physical vapor deposition process or a chemical vapor deposition process may be used to form the capacitor bottom conductive layer 341 and the capacitor top conductive layer 345. In some embodiments, an atomic layer deposition process may be used to form the capacitor bottom conductive layer 341 and the capacitor top conductive layer 345.

The capacitor dielectric layer 343 may include an oxide film, a nitride film, an insulating metal oxide film, a high dielectric film, a polymer film, or combinations thereof. The capacitor dielectric layer 343 may be formed by atomic layer deposition. In some embodiments, the capacitor dielectric layer 343 may be formed as a high dielectric layer having a dielectric constant higher than that of a silicon oxide layer. For example, the capacitor dielectric layer 343 may have a dielectric constant in the range of between about 10 to about 25. In some embodiments, the capacitor dielectric layer 343 may be formed of at least one material selected from the group including hafnium oxide, hafnium silicon oxide, hafnium oxynitride, hafnium silicon oxynitride, lanthanum oxide, lanthanum, uranium aluminum oxide, zirconium oxide, zirconium silicon oxide, zirconium oxide nitride, zirconium silicon oxynitride, tantalum oxide, titanium oxide, barium strontium titanium oxide, barium titanium oxide, strontium titanium oxide, yttrium oxide, aluminum oxide, and lead scandium tantalum oxide.

Figure 27:
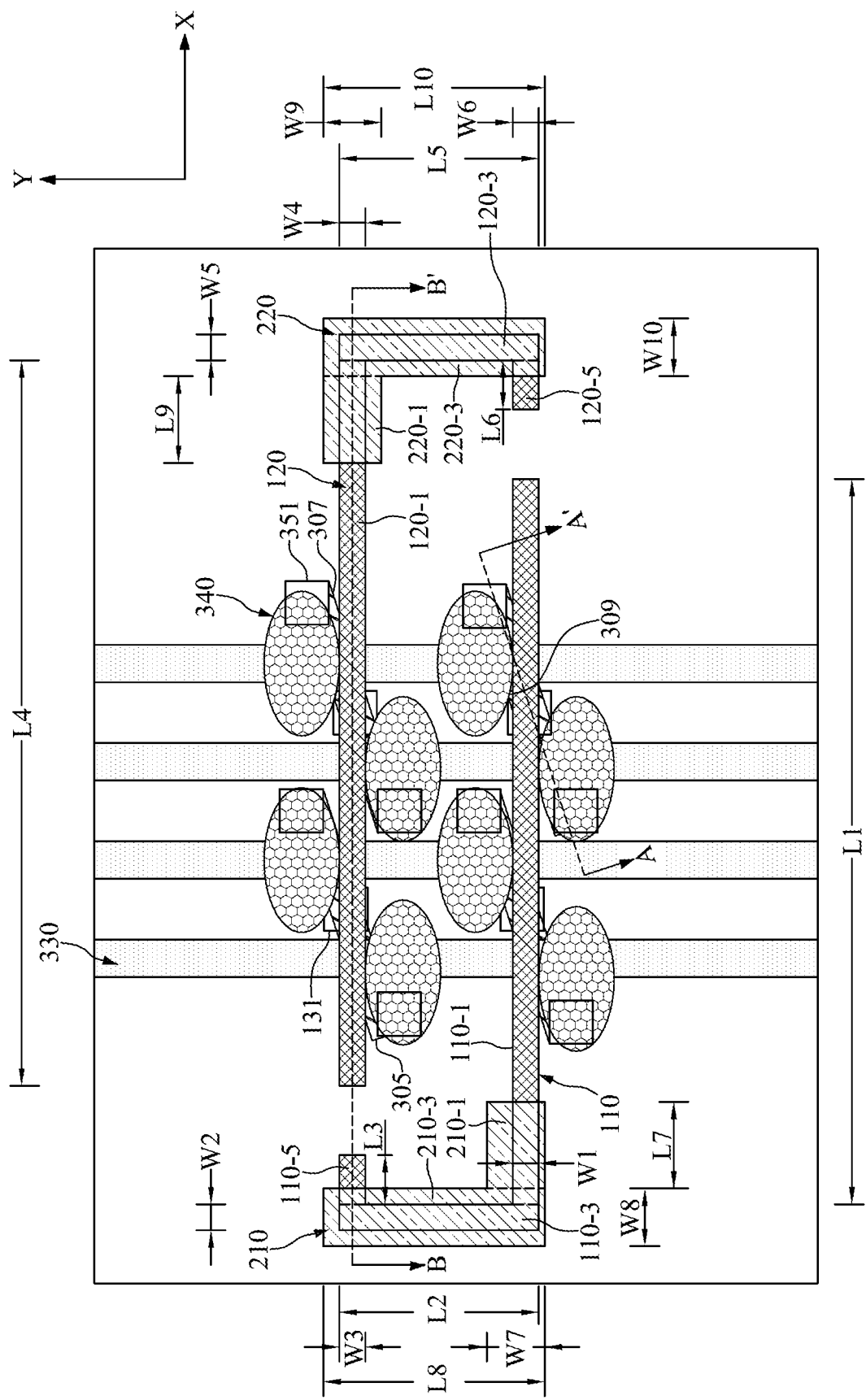
FIG. 27 illustrates, in a schematic top-view diagram, an intermediate semiconductor device in accordance with one embodiment of the present disclosure.
Figure 28:
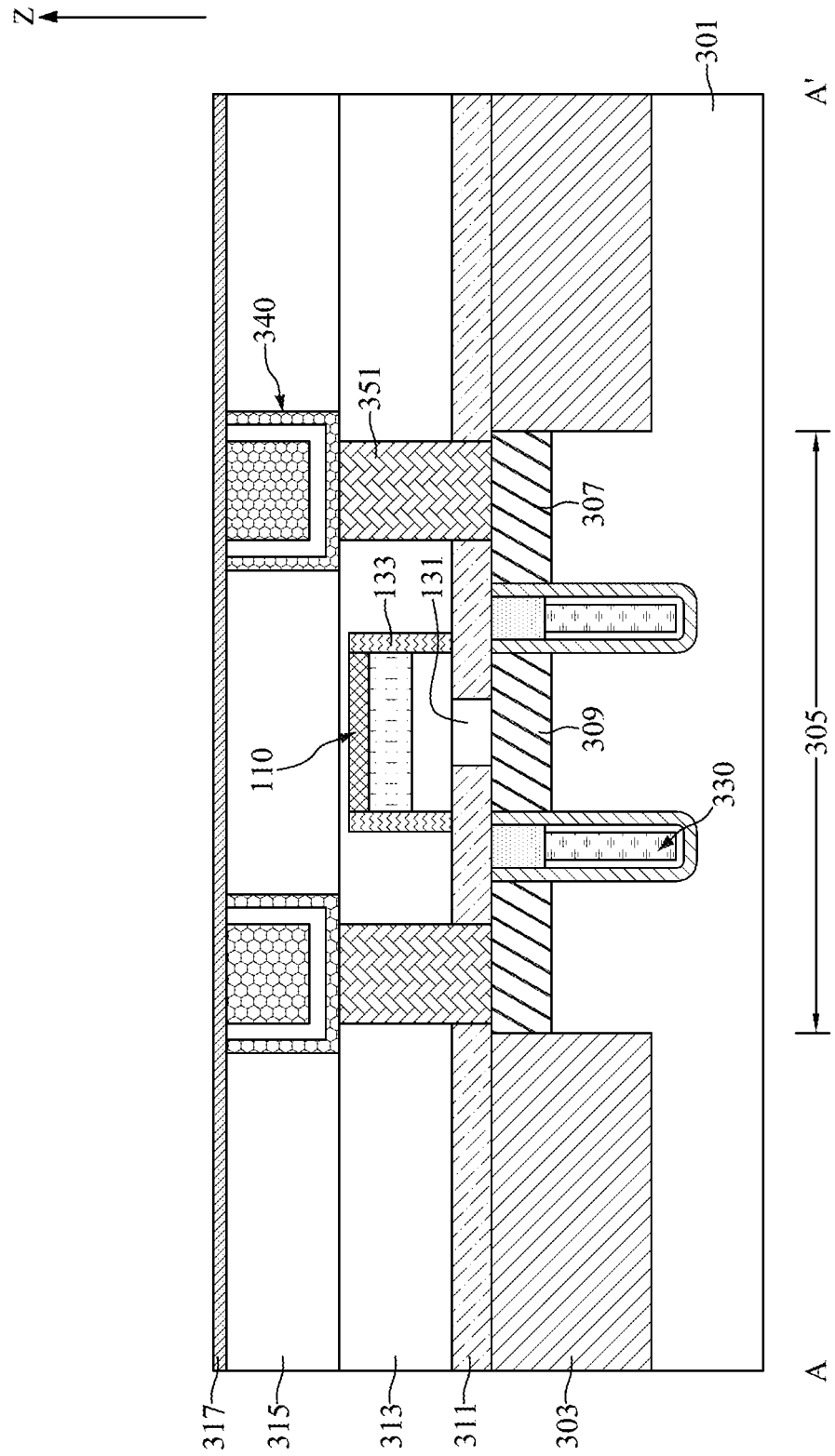
FIG. 28 is a schematic cross-sectional view diagram taken along a line A-A' in FIG. 27.
Figure 29:
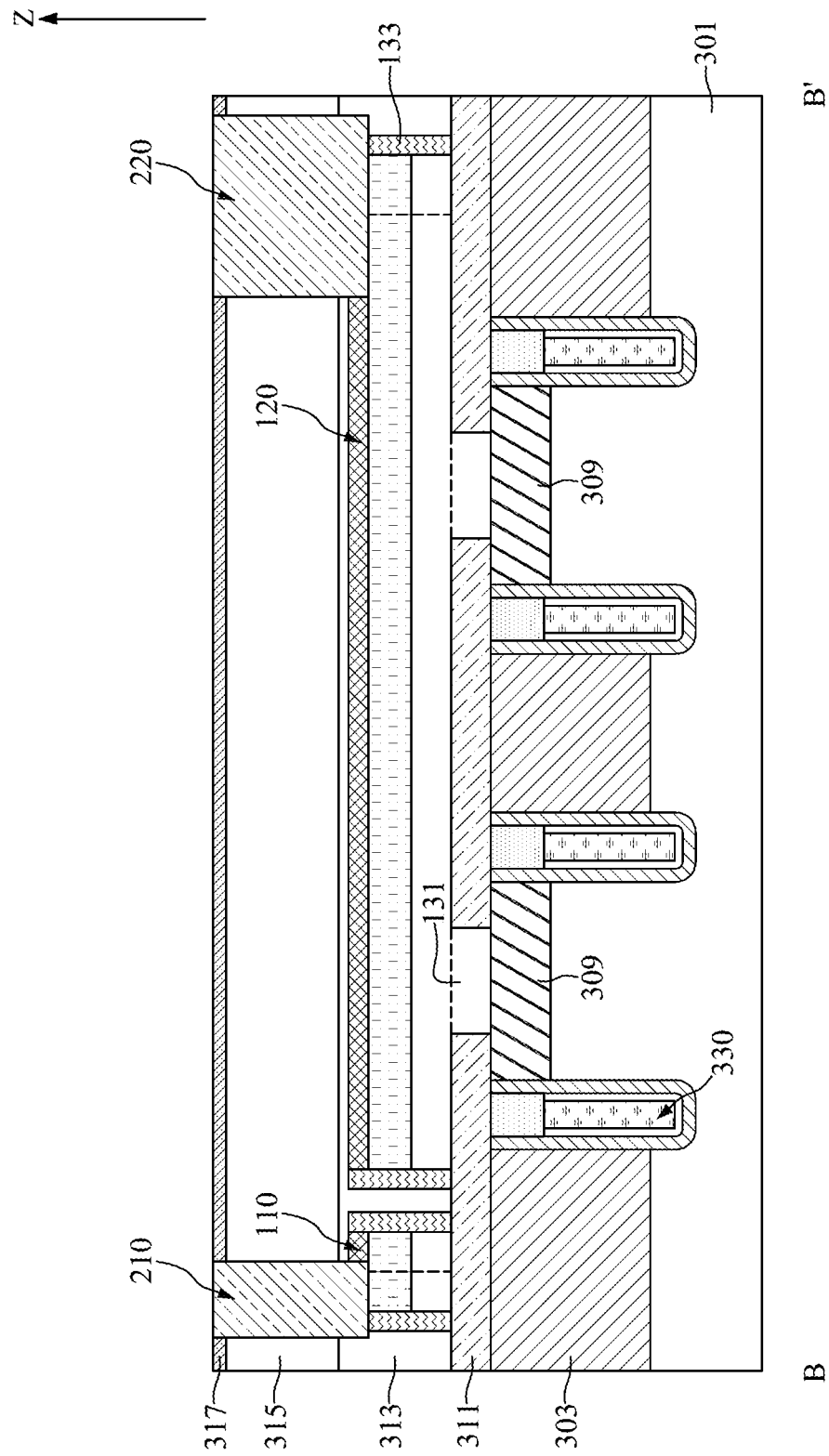
FIG. 29 is a schematic cross-sectional view diagram taken along a line B-B' in FIG. 27.
Figure 30:
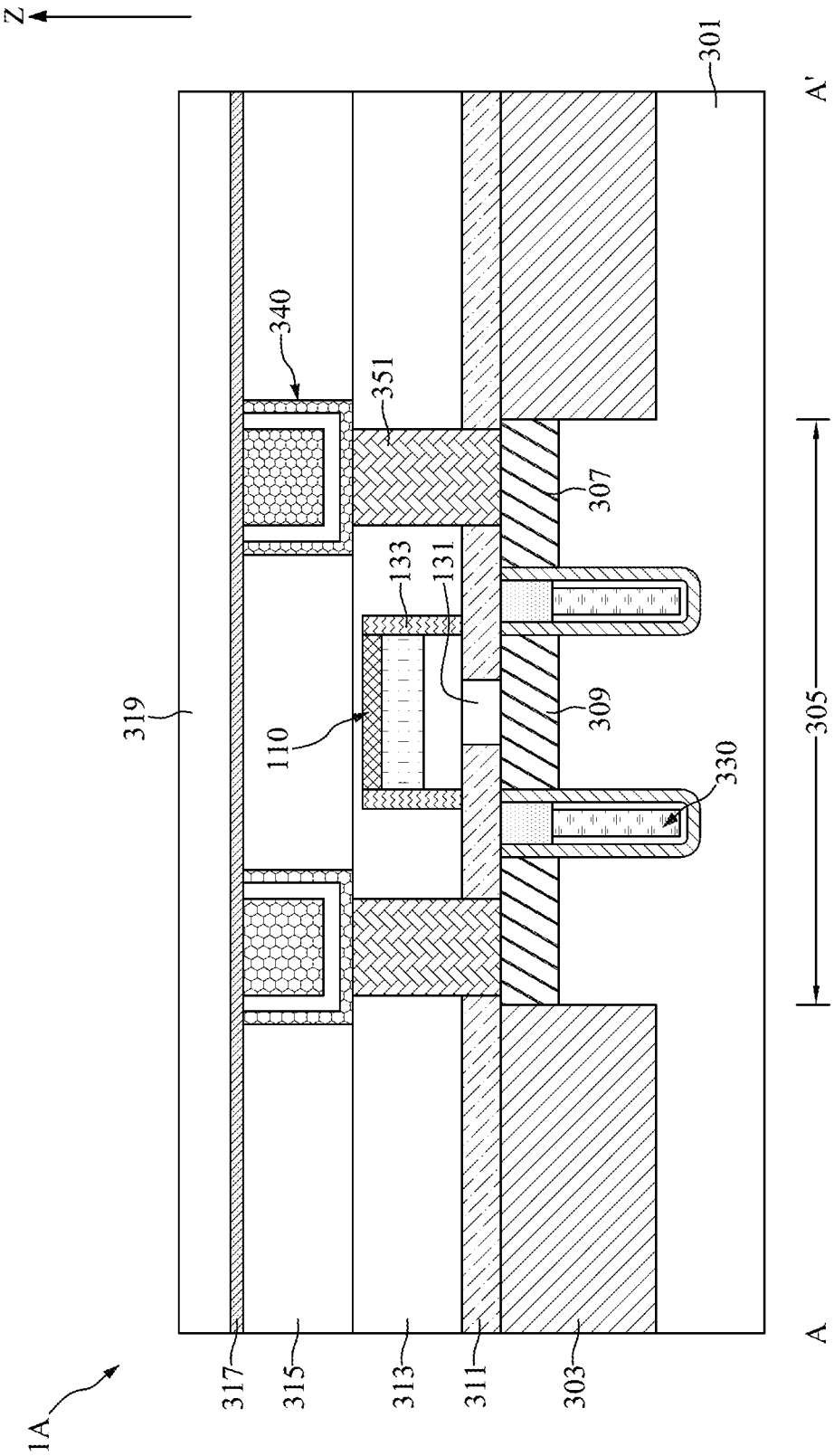
FIGS. 30 and 31 illustrate, in schematic cross-sectional view diagrams, part of the flow for fabricating the semiconductor device in accordance with one embodiment of the present disclosure.
Figure 31:
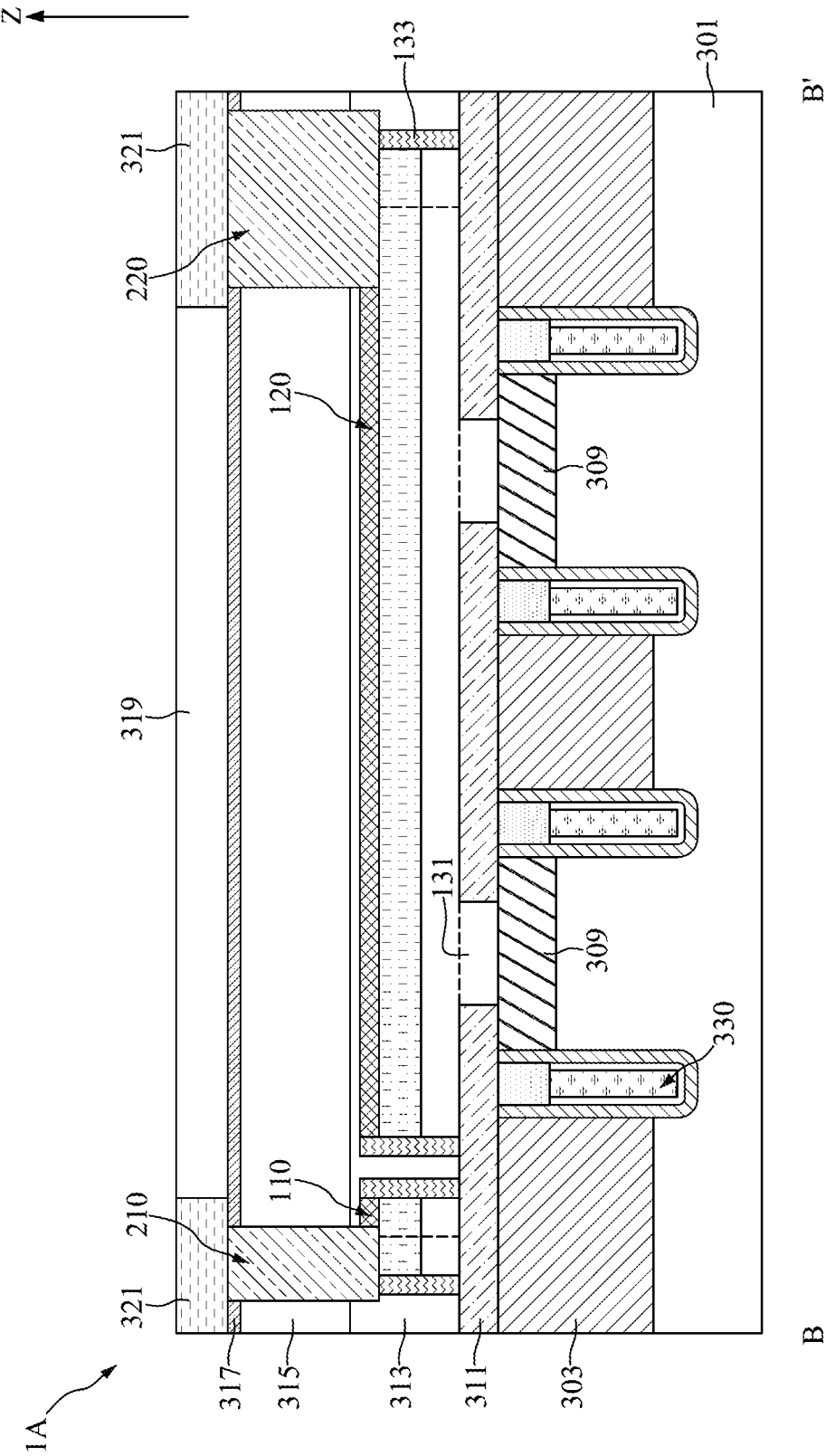

FIG. 27 illustrates, in a schematic top-view diagram, an intermediate semiconductor device in accordance with one embodiment of the present disclosure. FIG. 28 is a schematic cross-sectional view diagram taken along a line A-A' in FIG. 27. FIG. 29 is a schematic cross-sectional view diagram taken along a line B-B' in FIG. 27. FIGS. 30 and 31 illustrate, in schematic cross-sectional view diagrams, part of the flow for fabricating the semiconductor device 1A in accordance with one embodiment of the present disclosure.

With reference to FIG. 1 and FIGS. 27 to 29, at step S19, a first bit line top contact 210 may be formed on the first bit line structure 110, a second bit line top contact 220 may be formed on the second bit line structure 120, and a plurality of top conductive layers 321 may be formed to electrically couple to the first bit line top contact 210 and the second bit line top contact 220.

With reference to FIGS. 27 to 29, a fourth dielectric layer 317 may be formed on the third dielectric layer 315. In some embodiments, the fourth dielectric layer 317 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The fourth dielectric layer 317 may be formed by deposition processes such as chemical vapor deposition, plasma-enhanced chemical vapor deposition, or the like. In some embodiments, the fourth dielectric layer 317 may be optional.

With reference to FIGS. 27 to 29, a photolithography process may be performed on the fourth dielectric layer 317 to define the pattern of the first bit line top contact 210 and the second bit line top contact 220. After the photolithography process, an etch process, such as an anisotropic dry etch process, may be performed to form openings which expose a portion of the first bit line structure 110 and a portion of the second bit line structure 120. A conductive material such as tungsten, cobalt, zirconium, tantalum, titanium, aluminum, ruthenium, copper, metal carbides (e.g., tantalum carbide, titanium carbide, and tantalum magnesium carbide), metal nitrides (e.g., titanium nitride), transition metal aluminides, or combinations thereof may be deposited to fill the openings. A planarization process, such as chemical mechanical polishing, may be performed to remove excess material, provide a substantially flat surface for subsequent processing steps, and concurrently form the first bit line top contact 210 and the second bit line top contact 220.

With reference to FIGS. 27 to 29, the first bit line top contact 210 may include a first bar portion 210-1 and a second bar portion 210-3 in a top-view perspective. The first bar portion 210-1 may be line shape or bar shape in a top-view perspective. The first bar portion 210-1 may be arranged in parallel to the direction X and may be formed on the first end of the first line portion 110-1. The first bar portion 210-1 may include a first end (e.g., the left end in FIG. 27) and a second end (e.g., the right end in FIG. 27) opposite to the first end. The second bar portion 210-3 may be line shape or bar shape in a top-view perspective. The second bar portion 210-3 may connect to the first end of the first bar portion 210-1, arrange parallel to the direction Y, and formed on the second line portion 110-3.

In some embodiments, the width W7 of the first bar portion 210-1 and the width W8 of the second bar portion 210-3 may be the same. In some embodiments, the width W7 of the first bar portion 210-1 and the width W8 of the second bar portion 210-3 may be different. In some embodiments, the width W7 of the first bar portion 210-1 is greater than the width W1 of the first line portion 110-1. In some embodiments, the width W8 of the second bar portion 210-3 is greater than the width W2 of the second line portion 110-3. In some embodiments, part of the first end of the first line portion 110-1 may be covered by the second bar portion 210-3 in a top-view perspective. In some embodiments, none of the first end of the first line portion 110-1 is covered by the second bar portion 210-3 in a top-view perspective.

In some embodiments, the length L7 of the first bar portion 210-1 may be less than the length L1 of the first line portion 110-1. In some embodiments, the length L7 of the first bar portion 210-1 may be less than or equal to the length L8 of the second bar portion 210-3. In some embodiments, the length L7 of the first bar portion 210-1 may be greater than the length L8 of the second bar portion 210-3. In some embodiments, the length L8 of the second bar portion 210-3 may be greater than or equal to the length L2 of the second line portion 110-3. In some embodiments, the second line portion 110-3 may be completely covered by the second bar portion 210-3 in a top-view perspective. In some embodiments, the length L8 of the second bar portion 210-3 may be less than the length L2 of the second line portion 110-3 and may be greater than the width W7 of the first bar portion 210-1. In some embodiments, the second line portion 110-3 may be partially covered by the second bar portion 210-3 in a top-view perspective.

With reference to FIGS. 27 to 29, the second bit line top contact 220 may include a first bar portion 220-1 and a second bar portion 220-3 in a top-view perspective. The first bar portion 220-1 may be line shape or bar shape in a top-view perspective. The first bar portion 220-1 may be arranged in parallel to the direction X and may be formed on the second end of the first line portion 120-1. The first bar portion 220-1 may include a first end (e.g., the left end in FIG. 27) and a second end (e.g., the right end in FIG. 27) opposite to the first end. The second bar portion 220-3 may be line shape or bar shape in a top-view perspective. The second bar portion 220-3 may connect to the second end of the first bar portion 220-1, arrange parallel to the direction Y, and formed on the second line portion 120-3.

In some embodiments, the width W9 of the first bar portion 220-1 and the width W10 of the second bar portion 220-3 may be the same. In some embodiments, the width W9 of the first bar portion 220-1 and the width W10 of the second bar portion 220-3 may be different. In some embodiments, the width W9 of the first bar portion 220-1 is greater than the width W4 of the first line portion 120-1. In some embodiments, the width W10 of the second bar portion 220-3 is greater than the width W5 of the second line portion 120-3. In some embodiments, part of the second end of the first line portion 120-1 may be covered by the second bar portion 220-3 in a top-view perspective. In some embodiments, none of the second end of the first line portion 120-1 is covered by the second bar portion 220-3 in a top-view perspective.

In some embodiments, the length L9 of the first bar portion 220-1 may be less than the length L4 of the first line portion 120-1. In some embodiments, the length L9 of the first bar portion 220-1 may be less than or equal to the length L10 of the second bar portion 220-3. In some embodiments, the length L9 of the first bar portion 220-1 may be greater than the length L10 of the second bar portion 220-3. In some embodiments, the length L10 of the second bar portion 220-3 may be greater than or equal to the length L5 of the second line portion 120-3. In some embodiments, the second line portion 120-3 may be completely covered by the second bar portion 220-3 in a top-view perspective. In some embodiments, the length L10 of the second bar portion 220-3 may be less than the length L5 of the second line portion 120-3 and may be greater than the width W9 of the first bar portion 220-1. In some embodiments, the second line portion 120-3 may be partially covered by the second bar portion 220-3 in a top-view perspective.

With reference to FIGS. 30 and 31, a fifth dielectric layer 319 may be formed on the fourth dielectric layer 317. In some embodiments, the fifth dielectric layer 319 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The fifth dielectric layer 319 may be formed by deposition processes such as chemical vapor deposition, plasma-enhanced chemical vapor deposition, or the like.

With reference to FIGS. 30 and 31, the plurality of top conductive layers 321 may be formed in the fifth dielectric layer 319 by, for example, a damascene process. The plurality of top conductive layers 321 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The plurality of top conductive layers 321 may be electrically coupled to the first bit line top contact 210 and the second bit line top contact 220, respectively and correspondingly.

Figure 32:
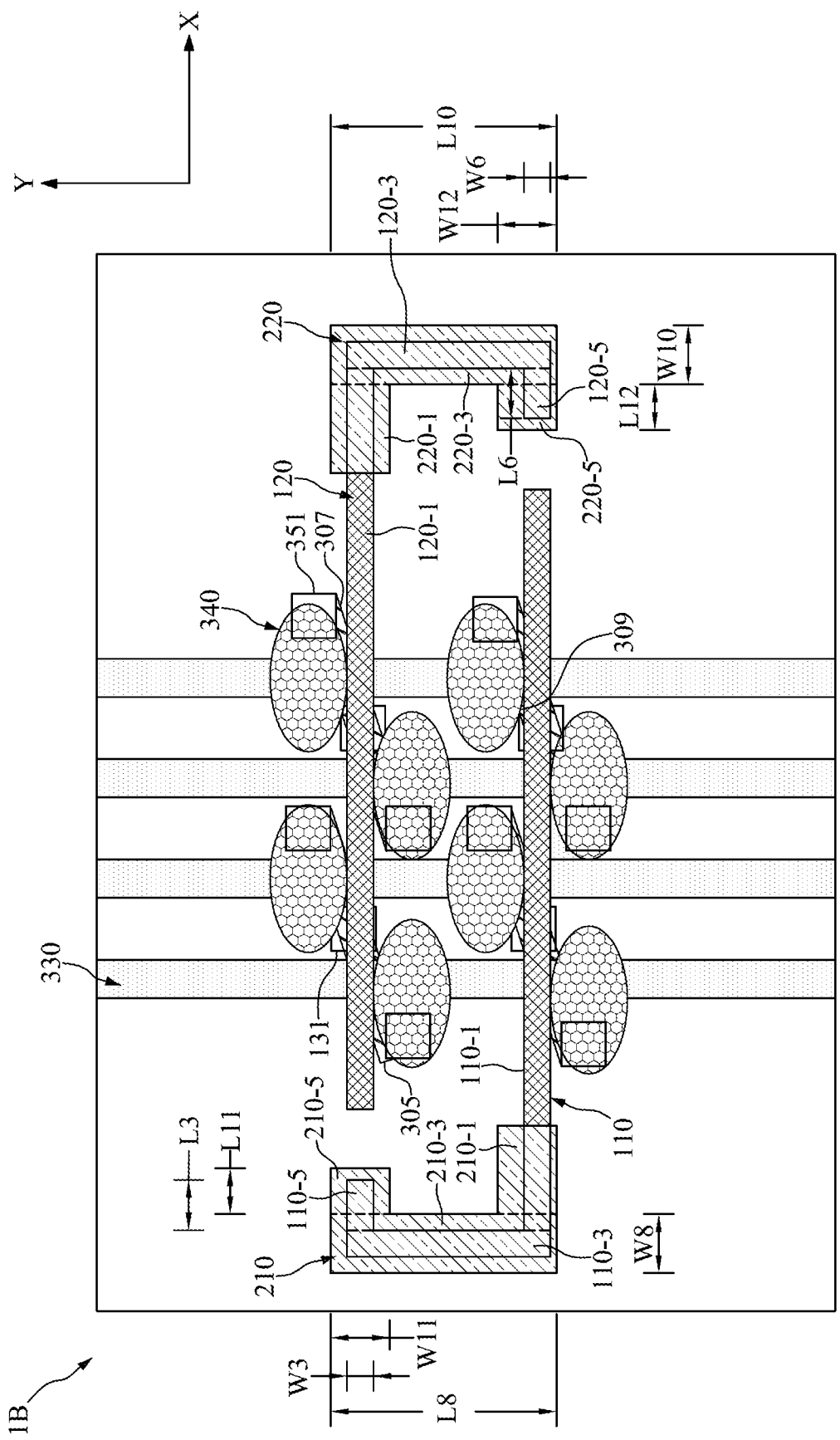
FIG. 32 illustrates, in a schematic top-view diagram, a semiconductor device in accordance with another embodiment of the present disclosure.

FIG. 32 illustrates, in a schematic top-view diagram, a semiconductor device 1B in accordance with another embodiment of the present disclosure.

With reference to FIG. 32, the semiconductor device 1B may have a structure similar to that illustrated in FIG. 27. The same or similar elements in FIG. 32 as in FIG. 27 have been marked with similar reference numbers and duplicative descriptions have been omitted.

In the semiconductor device 1B, the second bar portion 210-3 may include an upper end and a lower end opposite to the upper end. The first bar portion 210-1 may connect to the lower end of the second bar portion 210-3. The first bit line top contact 210 may further include a third bar portion 210-5. The third bar portion 210-5 may connect to the upper end of the second bar portion 210-3, arranged in parallel to the first bar portion 210-1, disposed toward to and distant from the first line portion 120-1.

In some embodiments, the third line portion 110-5 may be covered by the third bar portion 210-5 in a top-view perspective. In some embodiments, the width W11 of the third bar portion 210-5 may be greater than the width W3 of the third line portion 110-5. In some embodiments, the width W11 of the third bar portion 210-5 and the width W8 of the second bar portion 210-3 may be the same. In some embodiments, the width W11 of the third bar portion 210-5 and the width W8 of the second bar portion 210-3 may be different. In some embodiments, the length L11 of the third bar portion 210-5 may be greater than the length L3 of the third line portion 110-5. In some embodiments, the length L11 of the third bar portion 210-5 may be less than or equal to the length L3 of the third line portion 110-5. In some embodiments, the length L11 of the third bar portion 210-5 may be less than or equal to the length L8 of the second bar portion 210-3. In some embodiments, the length L11 of the third bar portion 210-5 may be greater than the length L8 of the second bar portion 210-3.

In the semiconductor device 1B, the second bar portion 220-3 may include an upper end and a lower end opposite to the upper end. The first bar portion 220-1 may connect to the upper end of the second bar portion 220-3. The second bit line top contact 220 may further include a third bar portion 220-5. The third bar portion 220-5 may connect to the lower end of the second bar portion 220-3, arranged in parallel to the first bar portion 220-1, disposed toward to and distant from the first line portion 110-1.

In some embodiments, the third line portion 120-5 may be covered by the third bar portion 220-5 in a top-view perspective. In some embodiments, the width W12 of the third bar portion 220-5 may be greater than the width W6 of the third line portion 120-5. In some embodiments, the width W12 of the third bar portion 220-5 and the width W10 of the second bar portion 220-3 may be the same. In some embodiments, the width W12 of the third bar portion 220-5 and the width W10 of the second bar portion 220-3 may be different. In some embodiments, the length L12 of the third bar portion 220-5 may be greater than the length L6 of the third line portion 120-5. In some embodiments, the length L12 of the third bar portion 220-5 may be less than or equal to the length L6 of the third line portion 120-5. In some embodiments, the length L12 of the third bar portion 220-5 may be less than or equal to the length L10 of the second bar portion 220-3. In some embodiments, the length L12 of the third bar portion 220-5 may be greater than the length L10 of the second bar portion 220-3.

One aspect of the present disclosure provides a semiconductor device including a substrate; a first bit line structure positioned above the substrate and including a first line portion arranged in parallel to a first direction, and a second line portion connecting to a first end of the first line portion and arranged in parallel to a second direction in perpendicular to the first direction; a first bit line top contact including a first bar portion positioned on the first end of the first line portion and arranged in parallel to the first direction, and a second bar portion connecting to a first end of the first bar portion, positioned on the second line portion, and arranged in parallel to the second direction; and a first top conductive layer electrically coupled to the first bit line top contact.

Another aspect of the present disclosure provides a method for fabricating a semiconductor device including providing a substrate; forming a first bit line structure above the substrate and including a first line portion arranged in parallel to a first direction, and a second line portion connecting to a first end of the first line portion and arranged in parallel to a second direction in perpendicular to the first direction; forming a first bit line top contact including a first bar portion on the first end of the first line portion and arranged in parallel to the first direction, and a second bar portion connecting to a first end of the first bar portion, on the second line portion, and arranged in parallel to the second direction; and forming a first top conductive layer electrically coupled to the first bit line top contact.

Due to the design of the semiconductor device of the present disclosure, the contact areas between the first bit line structure 110 and the first bit line top contact 210 and between the second bit line structure 120 and the second bit line top contact 220 may be greater. Therefore, the contact resistance between the first bit line structure 110 and the first bit line top contact 210 and between the second bit line structure 120 and the second bit line top contact 220 may be reduced. As a result, the performance (e.g., SWTR test in chip probing) of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a first bit line structure positioned above the substrate and comprising:
      a first line portion arranged in parallel to a first direction; and
      a second line portion connecting to a first end of the first line portion and arranged in parallel to a second direction in perpendicular to the first direction;
   a first bit line top contact comprising:
      a first bar portion positioned on the first end of the first line portion and arranged in parallel to the first direction; and
      a second bar portion connecting to a first end of the first bar portion, positioned on the second line portion, and arranged in parallel to the second direction; and
   a first top conductive layer electrically coupled to the first bit line top contact.

2. The semiconductor device of claim 1, further comprising a source region positioned in the substrate;
   wherein the first line portion of the first bit line structure is electrically coupled to the source region.

3. The semiconductor device of claim 2, further comprising a second bit line structure positioned at a same vertical level as the first bit line structure and comprising:
   a first line portion arranged in parallel to the first line portion of the first bit line structure and comprising a first end and a second end; and
   a second line portion connecting to the second end of the first line portion of the second bit line structure, arranged in parallel to the second line portion of the first bit line structure, and positioned toward the first line portion of the first bit line structure;
   wherein the first end of the first line portion of the second bit line structure is positioned toward the second line portion of the first bit line structure and the second end of the first line portion of the second bit line structure is opposite to the first end of the first line portion of the second bit line structure.

4. The semiconductor device of claim 3, further comprising a second bit line top contact positioned at a same vertical level as the first bit line top contact and comprising:
   a first bar portion arranged in parallel to the first direction, positioned on the second end of the first line portion of the second bit line structure, and comprising a first end and a second end; and
   a second bar portion connecting to the second end of the first bar portion of the second bit line top contact, positioned on the second line portion of the second bit line structure, and arranged in parallel to the second line portion of the first bit line structure;
   wherein the first end of the first bar portion of the second bit line top contact is positioned toward the second bar portion of the first bit line top contact and the second end of the first bar portion of the second bit line top contact is opposite to the first end of the first bar portion of the second bit line top contact.

5. The semiconductor device of claim 4, further comprising a second top conductive layer electrically coupled to the second bit line top contact.

6. The semiconductor device of claim 3, further comprising a third line portion connecting to the second line portion of the first bit line structure, aligned with the first line portion of the second bit line structure, and positioned toward to the first line portion of the second bit line structure.

7. The semiconductor device of claim 6, further comprising a third bar portion connecting to the second bar portion of the first bit line top contact and positioned on the third line portion of the first bit line structure.

8. The semiconductor device of claim 5, further comprising a third line portion connecting to the second line portion of the second bit line structure, aligned with the first line portion of the first bit line structure, and positioned toward to the first line portion of the first bit line structure.

9. The semiconductor device of claim 8, further comprising a third bar portion connecting to the second bar portion of the second bit line top contact and positioned on the third line portion of the second bit line structure.

10. The semiconductor device of claim 2, wherein a width of the first bar portion of the first bit line top contact is greater than a width of the first line portion of the first bit line structure.

11. The semiconductor device of claim 2, wherein a width of the second bar portion of the first bit line top contact is greater than a width of the second line portion of the first bit line structure.

12. The semiconductor device of claim 6, wherein the third line portion of the first bit line structure is completely covered by the second bar portion of the first bit line top contact in a top-view perspective.

13. The semiconductor device of claim 5, wherein a width of the first bar portion of the second bit line top contact is greater than a width of the first line portion of the second bit line structure.

14. The semiconductor device of claim 5, wherein a width of the second bar portion of the second bit line top contact is greater than a width of the second line portion of the second bit line structure.

15. The semiconductor device of claim 9, wherein the third line portion of the second bit line structure is completely covered by the second bar portion of the second bit line top contact.

16. The semiconductor device of claim 3, wherein a length of the second line portion of the first bit line structure is less than or equal to a distance between the first line portion of the first bit line structure and the first line portion of the second bit line structure.

17. The semiconductor device of claim 2, wherein a length of the second bar portion of the first bit line top contact is equal to or less than a length of the first bar portion of the first bit line top contact.

18. The semiconductor device of claim 2, wherein a length of the second bar portion of the first bit line top contact is greater than a length of the first bar portion of the first bit line top contact.

19. The semiconductor device of claim 2, wherein a length of the second bar portion of the first bit line top contact is greater than or equal to a length of the second line portion of the first bit line structure.

20. A method for fabricating a semiconductor device, comprising:
   providing a substrate;
   forming a first bit line structure above the substrate and comprising:
      a first line portion arranged in parallel to a first direction; and
      a second line portion connecting to a first end of the first line portion and arranged in parallel to a second direction in perpendicular to the first direction;
   forming a first bit line top contact comprising:
      a first bar portion on the first end of the first line portion and arranged in parallel to the first direction; and a second bar portion connecting to a first end of the first bar portion, on the second line portion, and arranged in parallel to the second direction; and forming a first top conductive layer electrically coupled to the first bit line top contact.

* * * * *